United States Patent
Watanabe

(10) Patent No.: US 7,355,544 B2
(45) Date of Patent: Apr. 8, 2008

(54) TAD A/D CONVERTER IN WHICH PULSE DELAY CIRCUIT IS INITIALIZED PRIOR TO EACH CONVERSION OPERATION FOR DERIVING AN OUTPUT DIGITAL VALUE

(75) Inventor: Takamoto Watanabe, Nagoya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 11/606,134

(22) Filed: Nov. 30, 2006

(65) Prior Publication Data

US 2007/0120723 A1 May 31, 2007

(30) Foreign Application Priority Data

Nov. 30, 2005 (JP) ............................. 2005-346510

(51) Int. Cl.
*H03M 1/60* (2006.01)

(52) U.S. Cl. ...................................... 341/157; 341/155
(58) Field of Classification Search ................ 341/157, 341/155, 166, 160; 377/42, 124, 126; 331/63, 331/66

See application file for complete search history.

(56) References Cited

U.S. PATENT DOCUMENTS

| | | | | |
|---|---|---|---|---|
| 5,055,845 A | * | 10/1991 | Ridkosil ...................... | 341/155 |
| 5,058,130 A | * | 10/1991 | Park ........................... | 375/230 |
| 5,396,247 A | * | 3/1995 | Watanabe et al. ........... | 341/157 |
| 6,771,202 B2 | | 8/2004 | Watanabe et al. ........... | 341/157 |
| 6,879,278 B2 | | 4/2005 | Watanabe et al. ........... | 341/157 |

FOREIGN PATENT DOCUMENTS

| | | |
|---|---|---|
| JP | H05-259907 | 10/1993 |
| JP | 2004-007385 | 1/2004 |
| JP | 2004-357030 | 12/2004 |

* cited by examiner

*Primary Examiner*—Peguy Jean Pierre
(74) *Attorney, Agent, or Firm*—Posz Law Group, PLC

(57) ABSTRACT

In a TAD (Time Analog-to-Digital) type of A/D converter in which delay units of a pulse delay circuit successively transfer a pulse signal during each of successive measurement intervals, with each delay unit applying an amount of delay determined by an analog input signal voltage, it is ensured that each new measurement interval begins as soon as the pulse delay circuit has become restored to an initialized condition after the preceding measurement interval. Output values expressing the number of delay units traversed by the pulse signal during a measurement interval are used directly as digital values representing the analog input signal voltage level.

18 Claims, 22 Drawing Sheets

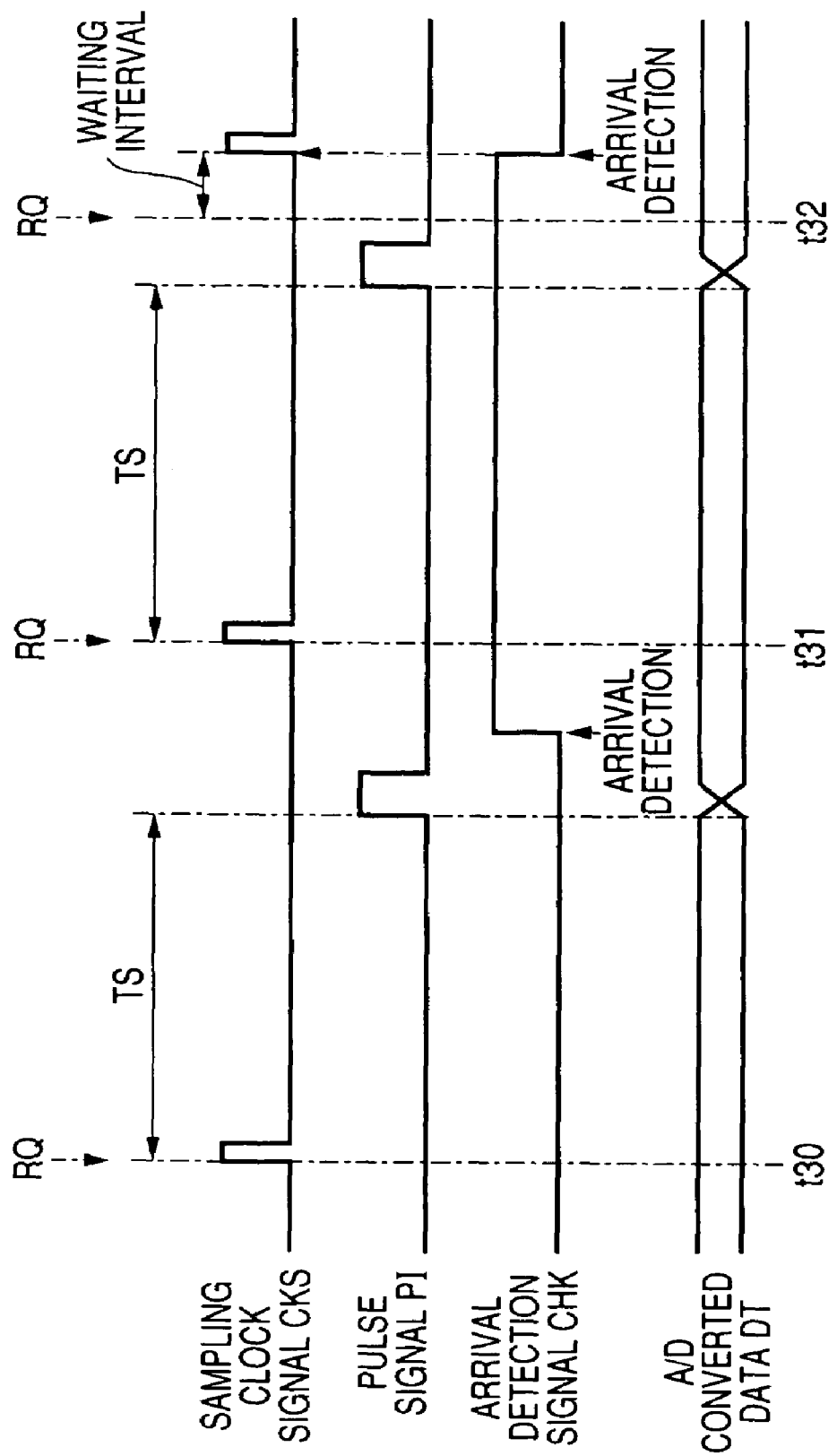

TAD A/D CONVERTER IN WHICH PULSE DELAY CIRCUIT IS INITIALIZED PRIOR TO EACH CONVERSION OPERATION FOR DERIVING AN OUTPUT DIGITAL VALUE

CROSS-REFERENCE TO RELATED APPLICATIONS

This application is based on and incorporates herein by reference Japanese Patent Application No. 2005-346510 filed on Nov. 30, 2005.

BACKGROUND OF THE INVENTION

1. Field of Application

The present invention relates to a TAD (Time Analog-to-Digital) type of A/D (Analog-to-Digital) converter, in which A/D converted data are obtained as respective values each expressing a number of stages of a series of delay units that have been traversed by a pulse signal during a measurement interval.

2. Description of Related Art

Various TAD types of A/D converters have been proposed, for example as described in Japanese patent first publication No. 5-259907 (referred to in the following as related document 1), in which a pulse delay circuit formed of a plurality of series-connected stages (with each stage made up of a delay unit) delays a pulse signal by an amount that is determined by (e.g., is inversely proportional to) the voltage level of an analog input signal, and in which A/D converted data are outputted as numeric values each expressing the voltage level of the analog input signal as the number of delay stages that are traversed by the pulse signal during a sampling interval. That number of stages can be obtained by simultaneously registering (e.g., using a latch circuit) the respective output signal values from the delay units at the end of the sampling interval, to thereby detect the position attained by the pulse signal within the pulse delay circuit up to that time point.

In addition as described in documents such as Japanese patent first publication No. 2004-7385 (referred to in the following as related document 2), rather than forming the pulse delay circuit as a linear delay line formed of a set of series-connected stages, the output signal from the final delay unit is transferred to a first input terminal of the first-stage one of a set of series-connected delay units, to form a ring-configuration delay line. With such an A/D converter, a pulse signal circulates continuously around the ring delay line formed by the pulse delay circuit. In each interval between successive sampling time points, a circulation number counter counts the total number of times the pulse signal circulates around the pulse delay circuit. At each sampling time point, the stage reached by the pulse signal within the pulse delay circuit (i.e., the respective output signal states of the delay stages) and the count value of the counter are registered, in respective latch circuits.

Hence, at each sampling time point, a digital numeric value is obtained that is made up a set of high-order bits which are based on the count value attained by the circulation number counter and a set of low order bits expressing the position reached by the pulse signal within the pulse delay circuit. Each A/D converted output value is obtained based on the difference between the currently obtained numeric value and the immediately previously obtained numeric value (read out from the latch circuits).

Another related example is described in Japanese patent first publication No. 2004-357030 (referred to in the following as related document 3), whose principles are based on those of the A/D converter of related document 2 above (i.e., using a pulse delay circuit formed of delay units that are connected as a ring delay line, and a circulation number counter). With that example, instead of detecting the number of delay stages that have been traversed by the pulse signal, at a single sampling time point in each conversion operation, that number is detected n times in succession in each conversion operation, (where n is an integer), at a plurality of sampling time points that successively differ in time by 1/n times the amount of delay that is currently being applied by each delay unit. In each conversion operation, the respective numeric values obtained at the n successive detection time points are summed, to obtain a numeric value having a higher resolution than is obtained when only a single detection operation is performed in each conversion operation. As described above, each output A/D converted value is obtained as the difference between the currently obtained numeric value and the immediately preceding (latched) numeric value.

Such a method (which is also described in reference document 2) provides increased speed of conversion and increased A/D conversion resolution.

With the A/D converter of reference document 1, control signals that determine the timings for activating the pulse delay circuit and determine the timings at which the respective output signal states of the stages of the pulse delay circuit registered by a latch circuit, are derived using a counter that counts a system clock signal (used as a sampling clock signal) and a decoder that decodes the count values of the counter, to obtain the control signals. In general, the period of such a system clock signal is made comparatively long, in order to ensure stable operation of the digital circuits.

With such an A/D converter, it is necessary to ensure that when the states (i.e., output signals) of the stages in the pulse delay circuit have been registered (i.e., latched), a sufficiently long waiting interval elapses before the pulse delay circuit is again activated to initiate traversing of the pulse delay circuit stages by a pulse signal. This is necessary to ensure that the "new" pulse signal will not be initiated before the "old" (i.e., previously initiated) pulse signal has been outputted from the final stage of the pulse delay circuit.

However with the A/D converter of reference document 1, the timings of a sampling clock signal for latching the states of the stages in the pulse delay circuit at respective sampling time points, and the timings of an activation control signal for periodically initiating a pulse signal, can only be determined based on the system clock signal. Thus, the aforementioned waiting interval can only have a value that is the inverse of the system clock frequency multiplied by an integer.

Hence, it is not possible to arbitrarily select that waiting interval to have a value that is the minimum necessary for ensuring stable operation of the A/D converter (i.e., a value which is only slightly longer than the maximum time required for a pulse signal to traverse all of the stages of the pulse delay circuit). Thus, the waiting interval must be made unnecessarily long, so that the A/D conversion rate (sampling rate) is correspondingly lowered.

The general configuration of an A/D converter having a ring delay line and a counter circuit that counts the number of circulations of a pulse signal around the ring delay line, as described in reference documents 2 or 3 is illustrated in FIG. 20, designated by numeral 100. Only the circuit sections necessary for detecting the output signal states of the stages of the pulse delay circuit at a single sampling time point in each conversion operation are shown. With such an A/D converter, after a pulse signal has been initiated by an activation control signal RR, the pulse signal continuously circulates around the pulse delay circuit 101. At each sampling time point defined by a sampling clock signal CKS, the states of the output signals from the pulse delay circuit 101 and the count value reached by the circulation counter circuit 103 are registered in the latch and encoder circuit 102 and latch circuit 104 respectively. In the latch and encoder circuit 102, the latched-in data (i.e., expressing the stage in the pulse delay circuit 101 reached by the pulse signal at the sampling timing) are decoded to obtain the low-order bits (indicated as "a" in FIG. 20) of a corresponding numeric value, while the count value of the circulation counter circuit 103, registered in the latch circuit 104, expresses the high-order bits (indicated as "b") of that numeric value. At the next sampling time point, the bits of the newly derived numeric value are registered in a latch 110.

At each sampling time point, the immediately previously obtained numeric value (indicated as DTn−1) is read out from the latch 110 and subtracted from the currently obtained numeric value (indicated as DTn), by a subtractor 112, to obtain an output A/D conversion data value expressing the total number of stages in the pulse delay circuit 101 that have been traversed by the pulse signal since the preceding sampling time point, with that value indicated as DT in FIG. 20.

More specifically, if the currently obtained numeric value DTn is lower than the immediately previously obtained numeric value DTn−1 (thereby indicating that overflow of the circulation counter circuit 103 has occurred, since the preceding sampling time point) then the subtraction operation is performed as {(DTn+k)−DTn−1}, where k is the maximum count value of the circulation counter circuit 103. If DTn is higher than DTn−1 then the subtraction operation is performed as {DTn−DTn−1}. This operation is illustrated in the graph and timing diagram of FIG. 6 in related document 2, in which the values designated as "IS" correspond to successively derived ones of the values DT of FIG. 20 described above.

Thus with such a TAD type of A/D converter, although a high rate of A/D conversion speed can be achieved, there is the disadvantage that it is necessary to incorporate additional latch and subtractor circuits, causing the overall circuit scale to be substantially increased.

SUMMARY OF THE INVENTION

It is a first objective of the present invention to overcome the disadvantages of the prior art described above, by providing a TAD type of A/D converter in which activation of the pulse delay circuit of the circuit (i.e., initiation of a pulse signal that traverses the pulse delay circuit) is performed after a waiting interval following each sampling time point, but whereby the duration of that waiting interval can be made shorter than has been possible in the prior art, thereby enabling a higher rate of successive A/D conversion operations to be achieved It is a second objective of the present invention to provide a TAD type of A/D converter whereby a high rate of successive A/D conversion operations can be achieved, without requiring a significant increase in the circuit scale of the A/D converter by comparison with the prior art.

To achieve the above objectives, according to a first aspect the present invention provides an A/D converter including a pulse delay circuit which is activated to transfer a pulse signal therethrough by an activation control signal such as a pulse signal that is inputted to the first stage of the pulse delay circuit, and which is formed of a plurality of delay units connected in series as successive delay stages to constitute a ring delay line. In the following, the term "activation" of a pulse delay circuit is used in the sense of initiating the transferring of a pulse signal (consisting of a single pulse) through successive delay units of the pulse delay circuit, starting from a first-stage delay unit. Each of the delay units applies an identical amount of delay to the pulse signal, with the delay amount varying in accordance with a voltage level of an analog input signal. For example when each delay unit is formed of a CMOS inverter, the analog input signal is applied as a power supply voltage of each of the delay units.

Such an A/D converter also includes a circulation number counter circuit for counting the number of complete circulations of the pulse signal around the pulse delay circuit after each activation, and a latch and encoder circuit that is controlled by an externally supplied sampling clock signal having a predetermined sampling period. At each of successive sampling time points, e.g., at each rising edge (low to high level) transition of the sampling clock signal, the respective states of the output signals produced from the delay unit, and an operation signal from the circulation number counter circuit (i.e., expressing the total number of circulations since commencement of activation) are registered by the latch and encoder circuit, which thus obtains the total number of the delay units traversed by the pulse signal since that commencement of activation. The latch and encoder circuit thereby derives a numeric value that can be directly utilized as an output A/D (analog-to-digital) converted value.

Such an A/D converter further includes a control signal generating circuit which operates based on the sampling clock signal to generate the activation control signal such as to inhibit circulation of the pulse signal around the pulse delay circuit during each of periodic pause intervals, and to activate the pulse delay circuit at the end of each pause interval. The pause interval duration is made longer than the circulation period of the pulse signal in the pulse delay circuit, and is made shorter than the sampling period.

The control signal generating circuit also produces an initialization signal for initializing the circulation number counter circuit, during each of the pause intervals.

The inhibiting of operation of the pulse delay circuit during each pause interval can be accomplished in either of two ways. The first of these is to halt circulation of the pulse signal around the pulse delay circuit for a sufficient duration, as with the present invention. An alternative method would be to forcibly reset each of the delay units (e.g., cause each delay unit to concurrently produce a low level output signal). To implement the first method, the pause interval is made longer than the time required for the pulse signal to circulate around the pulse delay circuit. In that way, the pulse delay circuit can be initialized in a simple manner, since it is not necessary to separately reset each of the delay units before each new activation (i.e., each new A/D conversion operation) begins.

Since the pulse delay circuit and the circulation number counter circuit are each initialized before the start of each activation interval in which the pulse signal circulates in the pulse delay circuit, each numeric value that is derived by the latch and encoder circuit at the end of an activation interval can be directly utilized as an output A/D converted value. Hence, it is not necessary to provide additional elements that are necessary with the prior art of reference documents 2 and 3, such as the latch 110 and subtractor 112 of the prior art example of FIG. 20 that are used for obtaining each output A/D converted value as the difference between a currently derived numeric value and a precedingly derived numeric value. Thus, if the A/D converter is to be implemented in LSI form, the total LSI chip area that is occupied by the circuits of the A/D converter can be reduced, with the present invention, so that the manufacturing costs can be reduced.

Moreover, with an A/D converter according to the first aspect of the invention described above, since the pause interval can be made substantially shorter than the sampling period, and the duration of each activation interval of the pulse delay circuit is reduced (in relation to the sampling period) only by the duration of a pause interval, high-speed continuous A/D conversion operation can be achieved.

Preferably, the duration of the pause interval is made as short as possible, consistent with being longer than the circulation period of the pulse delay circuit. Optimally, it should be made identical to the circulation period. In that way, the amount of dead time within each sampling period (i.e., time during which A/D conversion processing is not being performed) can be minimized, so that each sampling interval can be utilized more efficiently, for enhanced A/D conversion performance. However in any case, the duration of the pause interval should be made less than 1/5 of the sampling period.

With such an A/D converter, the control signal generating circuit preferably includes an edge detector circuit formed of a timing delay circuit which delays the sampling clock signal by an amount that defines the pause interval and a logic gate circuit which is supplied with the sampling clock signal and the output (delayed sampling clock) signal from the timing delay circuit. The edge detector circuit detects specific logic level transitions of the sampling clock signal (e.g., each low to high level transition) and produces the activation control signal, and the control signal generating circuit generates the activation signal and the initialization signal based on the output signal from the timing delay circuit.

The timing delay circuit is preferably formed of a plurality of delay units connected in series as respective delay stages, with each of the delay units having identical delay characteristics to those of the delay units of the pulse delay circuit.

With the analog input signal applied as a power supply voltage to each of the delay units (e.g., with these being formed as respective CMOS transistor inverters) of the pulse delay circuit, if the analog input signal is also applied as a power supply voltage to the timing delay circuit, the total number of delay units of the timing delay circuit is made greater than the total number of the delay units in the pulse delay circuit, to thereby ensure that the pause interval can be made longer than the circulation period of the pulse signal in the pulse delay circuit.

Alternatively, if the total number of delay units of the timing delay circuit is made approximately equal to the total number of the delay units in the pulse delay circuit, then it is necessary to ensure that the power supply voltage applied to the timing delay circuit is always lower than the voltage level of the analog input signal. That is, the power supply voltage of the timing delay circuit must be lower than the lowest level in the permissible range of variation of the analog input signal voltage level. In that way it can be reliably ensured that the duration of the pause interval is made longer than the circulation period of the pulse signal in the pulse delay circuit (ring delay line).

The latter condition can be satisfied by applying a fixed DC voltage as the power supply voltage of the timing delay circuit, which is lower than the lowest attainable voltage level of the analog input signal. Alternatively, it can be satisfied by voltage-dividing the analog input signal, and applying the resultant voltage-divided signal as the power supply voltage of the timing delay circuit.

From a second aspect, the invention provides an A/D converter basically as described above, but whereby the conversion resolution can be increased. Such an A/D converter has n pulse position numeric conversion circuits (wherein n is an integer of 2 or more) each of which is coupled to a (ring delay line configuration) pulse delay circuit and circulation number counter circuit as described above, and performs the functions of the latch and encoder circuit described above. Each of the pulse position numeric conversion circuits receives a corresponding one of n individual sampling clock signals, and periodically derives a numeric value expressing a total number of the delay units traversed by the pulse signal during an individual measurement interval that extends from an activation time point up to a sampling time point that is defined by the corresponding individual sampling clock signal, with the total number of traversed delay units varying in inverse proportion to the voltage level of the analog input signal.

Such an A/D converter further includes a shift circuit for generating the n individual sampling clock signals based on the sampling clock signal, with the individual sampling clock signals successively differing in phase from one another by an amount equal to 1/n times an amount of delay that is currently being applied by each of the delay units. The A/D converter also includes an addition circuit for periodically adding together respective numeric values produced by the pulse position numeric conversion circuits, to obtain an output A/D (analog-to-digital) converted value based on a result of the addition.

As a result of summing the respective numeric values that are derived by the pulse position numeric conversion circuits for measurement intervals that are of respectively different duration, at each A/D conversion operation, the output A/D converted data have a higher resolution than that of the numeric data produced from a single pulse position numeric conversion circuit. Specifically, the resolution is increased by $\log_2 n$ bits. Hence, increased resolution of A/D conversion can be achieved while maintaining a high speed of operation.

According to a third aspect, the invention provides an A/D converter having n converter core sections which operate in common on an analog input signal, and each comprise a pulse delay circuit configured of delay units arranged as a ring delay line and include a circulation number counter circuit, as described for the first aspect of the invention above, with each of the converter core sections operating in common on an analog input signal. Each converter core section also includes a latch and encoder circuit as described above, controlled by an externally supplied sampling clock signal to periodically derive an output numeric value in accordance with the number of delay units traversed by a pulse signal during a measurement interval.

However the converter core sections operate with measurement intervals of respectively different durations. The A/D converter includes a control signal generating circuit that operates based on the voltage level of the analog input signal and synchronized with the (externally supplied) clock signal, and generates n individual activation control signals that successively differ in phase from one another by an amount equal to 1/n times a delay time that is currently being applied by each of the delay units (i.e., a delay time is determined by the voltage level of the analog input signal at the current time point).

These individual activation control signals are supplied to corresponding ones of the converter core sections, to determine respectively different individual sampling intervals of these. As described for the A/D converter of the first aspect above, each activation control signal periodically inhibits operation of the pulse delay circuit in each converter core section, during an individual pause interval (i.e., whose timings are specific to that converter core section) of appropriate duration, and activates that pulse delay circuit at the end of each individual pause interval. The control signal generating circuit also produces an initialization signal for initializing the circulation number counter circuit of each converter core section during each individual pause interval.

Such an A/D converter further includes an addition circuit for periodically adding together respective numeric values that are produced by the converter core sections at each sampling time point, to obtain an output A/D (analog-to-digital) converted value based on a result of the addition.

Hence with this embodiment too, increased resolution can be achieved by comparison with that obtainable by a single converter core section, i.e., the resolution of the output A/D converted data from the addition circuit is increased by $\log_2 n$ bits by comparison with the numeric data produced from each converter core section. This advantage is obtained in addition to the advantages described above for the first aspect of the invention.

By utilizing a ring delay line configuration pulse delay circuit, an A/D converter having a high level of conversion resolution can be achieved, as described above. However if such high resolution is not required, it is possible to reduce the circuit scale of the A/D converter by utilizing a series of delay units connected in series as a straight delay line.

Hence the invention also provides an A/D converter including a pulse delay circuit formed of a plurality of delay units connected in series as a straight delay line, which is activated to commence transferring a pulse signal at each of respective activation time points, with each of the delay units functioning as described above, i.e., delaying the pulse signal with a delay amount that varies in accordance with the voltage level of an analog input signal.

In the case of a straight delay line configuration, activation is performed by inputting a pulse signal to the first-stage delay unit, as an activation signal. The A/D converter also includes a latch and encoder circuit controlled by a fixed-period sampling clock signal, for periodically obtaining the total number of delay units traversed by the pulse signal from a preceding activation time point up to a sampling time point, and for producing an output A/D converted value in accordance with the total number.

Such an A/D converter preferably includes an arrival detection circuit for producing an arrival detection signal that indicates each time point at which the pulse signal is outputted from (or arrives at) the final-stage delay unit of the pulse delay circuit, and a control signal generating circuit which operates from the sampling clock signal and the arrival detection signal. Following each activation time point, the control signal generating circuit inhibits further activation of the pulse delay circuit until the arrival detection signal indicates that a pulse signal resulting from an immediately preceding activation has reached the final-stage delay unit.

In that way, it is reliably ensured, in a very simple manner, that the pulse delay circuit is always in an initialized condition (i.e., with no pulse signal currently traversing the delay units) at the start of each activation of the pulse delay circuit. Hence, high-speed continuous A/D conversion operation can be achieved, with a simple and small-scale circuit.

The A/D conversion resolution of such an A/D converter can be increased, as described above for the case of utilizing a ring delay line configuration pulse delay circuit, by connecting a plurality of latch and decoder circuits in common to the straight delay line configuration pulse delay circuit. That is to say, the latch and decoder circuits are supplied with respective individual sampling clock signals which are successively shifted in phase with respect to one another by a unit time amount, which is equal to the amount of delay that is currently being applied to the pulse delay circuit by each of the delay units (i.e., a delay that depends upon the voltage level of the analog input signal). By periodically summing the respective numeric values that are derived by these latch and decoder circuits, output A/D converted data can be obtained that is of higher resolution that the output data of an individual latch and decoder circuit, for the reasons described above.

In that way, an A/D converter having high resolution and high A/D conversion speed can be achieved, with only a small-scale circuit being required.

Alternatively, a plurality of converter core sections can be utilized, each formed of a pulse delay circuit having a straight delay line configuration and a latch and decoder circuit, with respective individual activation signals being supplied to these, such that they operate with respectively different-duration sampling intervals as described hereinabove. Generating of the respective individual activation signals is controlled such that a new set of individual activation time points (to begin a new A/D conversion operation) it not established until it is confirmed (based on the respective individual arrival detection signals of the converter core sections) that all of the pulse delay circuits of the converter core sections have returned to the initialized state.

By periodically summing the respective numeric values that are derived by these converter core sections, output A/D converted data can be obtained that are of higher resolution than the numeric values produced from each of the converter core sections, for the reasons described above, without requiring an increase in the sampling period of the A/D converter by comparison with the case in which only a single pulse delay circuit and latch and encoder circuit are utilized.

The invention further teaches an alternative configuration for an A/D converter utilizing a pulse delay circuit having a straight delay line configuration and a latch and decoder circuit, whereby it is ensured in a very simple manner that the pulse delay circuit has reliably returned to the initialized condition prior to each new activation of the pulse delay circuit. With that configuration, a control signal generating circuit operates from a sampling clock signal to generate an activation signal having an activation period that is at least twice the period of the sampling clock signal. Specifically, the activation period is made k times the sampling period, where k is an integer of 2 or greater, and is made longer than the maximum time required for the pulse signal to completely traverse the pulse delay circuit (i.e., under a condition in which the analog input signal voltage is at the lowest of a range of permissible levels).

In addition, it is ensured that the sampling period is shorter than the minimum time required for the pulse signal to completely traverse the pulse delay circuit (i.e., under a condition in which the analog input signal voltage is at the highest of a range of permissible levels).

In that way it can be ensured that at the start of each activation of the pulse delay circuit (i.e., start of each sampling interval), the pulse delay circuit will have already reliably returned to the initialized condition. However as a result of this mode of operation, a valid sample is only obtained at one out of every two successive sampling time points, i.e., one of every two numeric values that are derived by the latch and encoder circuit is processed as non-valid data.

According to another aspect, the invention provides an A/D converter having a pulse delay circuit formed as a straight delay line and an arrival detection circuit for producing an arrival detection signal that indicates each time point at which the pulse signal reaches the final-stage delay unit of the pulse delay circuit, as described above, with the arrival detection signal being supplied to a control signal generating circuit. However in this case, an externally supplied sampling clock signal is not utilized to control the operation timings of the activation signal. Instead, each time an A/D conversion operation is to be performed, an externally supplied request signal is inputted to the control signal generating circuit.

The signal generating circuit responds to the activation request signal by supplying an activation signal to the pulse delay circuit, and also supplies a latch signal to the latch and encoder circuit for defining a sampling time point, after a predetermined interval has elapsed following activation of the pulse delay circuit. Following each activation, the control signal generating circuit inhibits further activation of the pulse delay circuit (i.e., in response to a subsequent inputting of the activation request signal) until the arrival detection signal indicates that a pulse signal resulting from an immediately precedingly activation has reached the final-stage delay unit.

In that way it is ensured that each A/D conversion operation can begin as soon as possible when an activation request signal is received, i.e., as soon as the pulse delay circuit returns to the initialized condition, if it has not already done so.

BRIEF DESCRIPTION OF THE DRAWINGS

FIG. 18 is a timing diagram for describing the operation of the tenth embodiment;

DESCRIPTION OF PREFERRED EMBODIMENTS

First Embodiment

Figure 1:
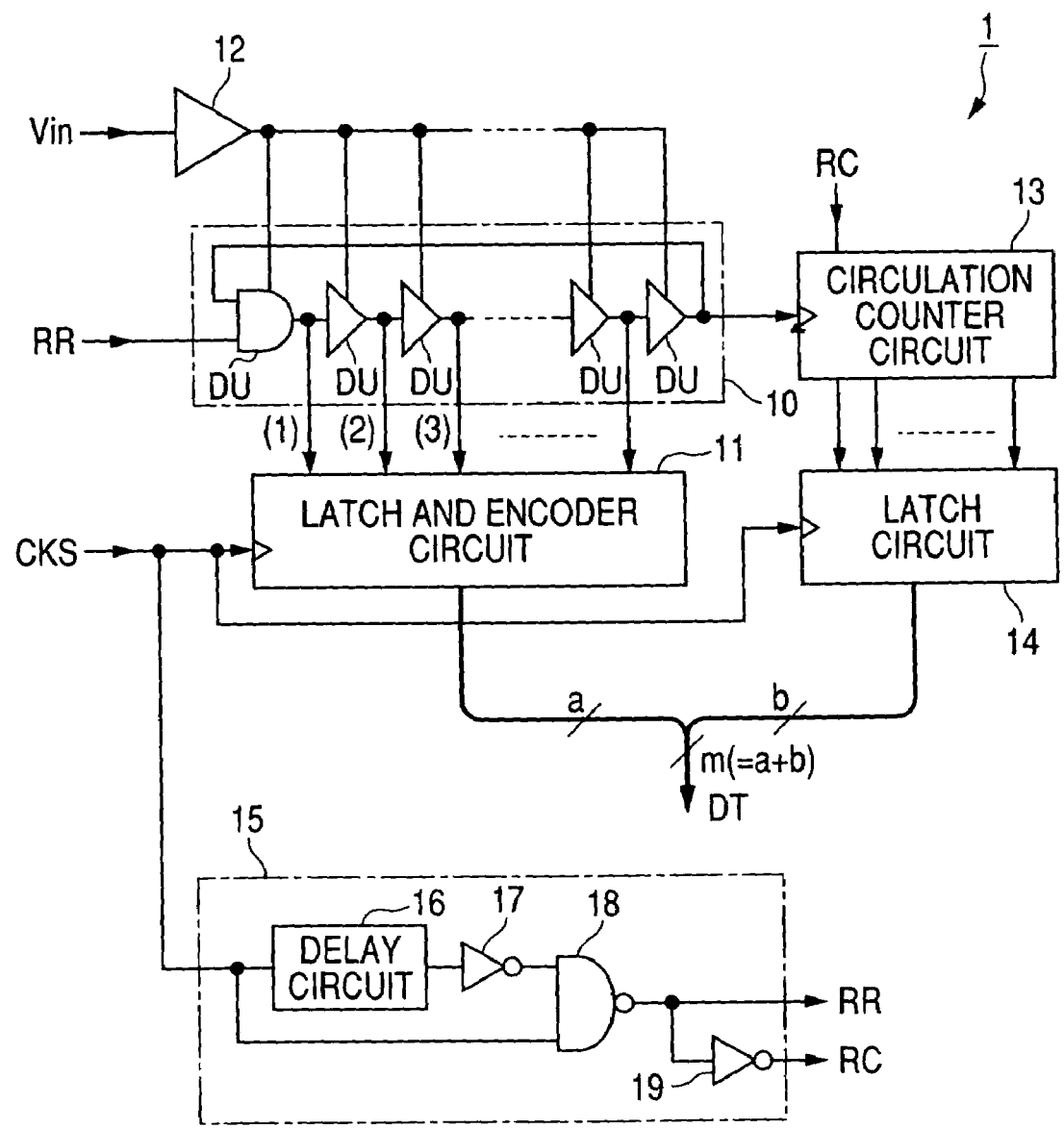
FIG. 1 shows the overall circuit configuration of a first embodiment of an A/D converter.

FIG. 1 shows the general configuration of a first embodiment of a TAD type of A/D converter, designated by reference numeral 1, for converting the level of an analog input signal Vin to successive digital data values. As shown, the A/D converter 1 includes a pulse delay circuit 10 formed of plurality of M series-connected delay units DU (where M is a positive integer), with the output from the final-stage delay unit connected to one input of a 2-input initial delay stage of the pulse delay circuit 10. That is to say, the first stage provides the same amount of delay as the other delay units DU, but also performs a 2-input AND logic function. The pulse delay circuit 10 is thereby formed as a ring delay line.

Each of the delay units DU (other than the first-stage unit) has an identical configuration, formed of two CMOS inverters connected in series, with the analog input signal Vin being applied (from the output of the buffer circuit 12) as a power supply voltage of each inverter. A detailed description of an example of a pulse delay circuit such as the pulse delay circuit 10 is provided for example in Japanese patent publication No. 6-216721, so that further description is omitted herein.

Although not shown in FIG. 1, the pulse delay circuit 10 is configured such that while there is no pulse signal circulating around the pulse delay circuit 10, the output from the final-stage delay unit is held the high logic level. In that condition, when the activation control signal RR goes from the low to the high level, a pulse signal begins to circulate around the ring delay line formed by the pulse delay circuit 10, i.e., the pulse delay circuit 10 is activated.

In addition, while the activation control signal RR is held at the low level, transfer of the pulse signal through the first-stage delay unit is inhibited, so that circulation of the pulse signal around the pulse delay circuit 10 is inhibited under that condition.

The voltage level of the input signal Vin determines the amount of signal transmission delay that is provided by each delay unit, i.e., the pulse signal is delayed by an amount that varies substantially in inverse proportion to the voltage level of the input signal Vin, in passing through each of the delay units DU. The respective stage numbers of the delay units DU are indicated as (1), (2), etc., in FIG. 1.

At each of respective sampling time points, which in this embodiment each correspond to a rising edge of a sampling clock signal CKS, the respective output signal states of the delay units DU are registered in a latch and encoder circuit 11, to thereby detect the position (along the series of delay stages) reached by the pulse signal, starting from the first-stage delay unit. That position is then converted by the latch and encoder circuit 11 into a binary number having "a" bits, where "a" is a fixed integer.

A circulation counter circuit 13 (a b-bit counter, where "b" is a fixed integer) is released from a reset condition (applied by a counter initialization signal RC) at the point when the pulse signal is initiated as described above, and thereafter counts the number of times that the pulse signal is outputted from the final-stage delay unit of the pulse delay circuit 10, to thereby count the number of times that the pulse signal circulates around the ring delay line. At each sampling time point, the sampling clock signal CKS registers the count value reached up to that point, in a latch circuit 14, i.e., as a binary number having "b" bits.

The decoded value obtained by the latch and encoder circuit 11 and the count value held in the latch circuit 14 thus respectively constitute the low-order bits and the high-order bits of an m-bit numeric value DT (where m=a+b), with DT expressing the total amount of delay stages traversed by the pulse signal during the interval from the preceding sampling time point up to the current sampling time point. Hence, DT constitutes an output A/D conversion value that is directly proportional to the voltage level of the input signal Vin.

The embodiment further includes a control signal generating circuit 15, for generating the activation control signal RR and the counter initialization signal RC, with these signals being generated based on the sampling clock signal CKS.

With this embodiment, the circulation counter circuit 13 is configured to be initialized when the counter initialization signal RC, which is normally held at the low level, goes to the high level.

As shown, the control signal generating circuit 15 is formed of a delay circuit 16, inverters 17, 19, and a NAND gate 18. The delay circuit 16 delays the sampling clock signal CKS by an delay time TR, while the inverter 17 inverts the output signal from the delay circuit 16. The output from the NAND gate 18 goes to the low level when both the sampling clock signal CKS and the output signal from the inverter 17 are at the high level, with that output signal from the NAND gate 18 constituting the activation control signal RR. The inverter 19 inverts the output signal from the NAND gate 18 to thereby produce the counter initialization signal RC.

Figure 3:
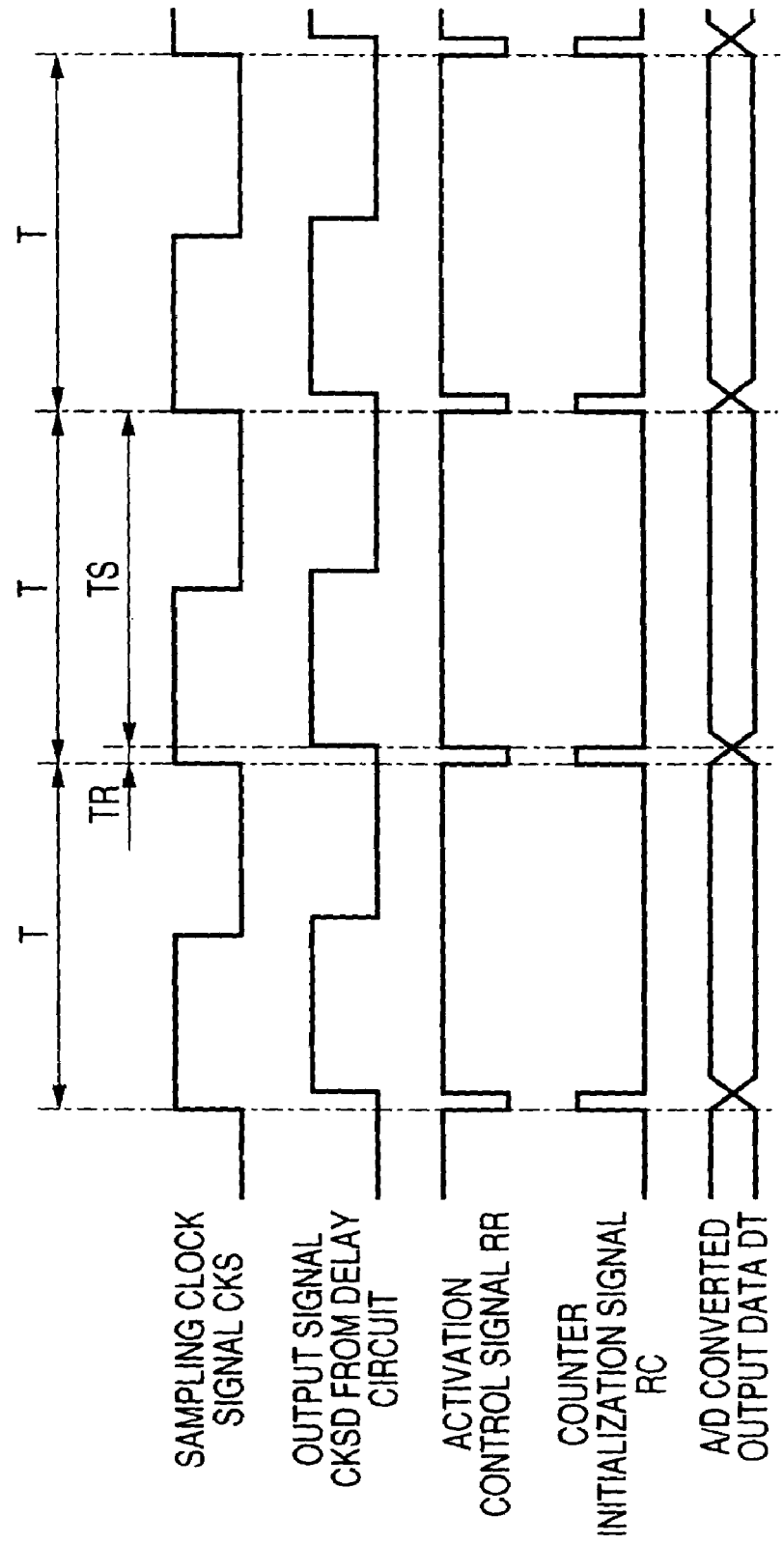
FIG. 3 is a timing diagram for describing the operation of the first embodiment.

As illustrated in the timing diagram of FIG. 3, in which the period of the sampling clock signal CKS is designated as T, the activation control signal RR from the NAND gate 18 periodically goes to the low level during a delay interval TR of the delay circuit 16, that extends from a rising edge of the sampling clock signal CKS until a succeeding rising edge of the output signal (indicated as CKSD) from the delay circuit 16. At all other times, the activation control signal RR remains at the high level.

The output signal RC from the inverter 19 (the counter initialization signal) is at the high level during each interval in which the activation control signal RR is at the low level, i.e., from a rising edge of the sampling clock signal CKS until the delay interval TR of the delay circuit 16 elapses and the output signal CKSD of the delay circuit 16 goes to the high level. At all other times, the counter initialization signal RC remains at the high level. In FIG. 3, each interval in which the activation control signal RR and the counter initialization signal RC respectively remain at the high and low levels is indicated as TS, referred to in the following as a sampling interval.

Figure 2A:
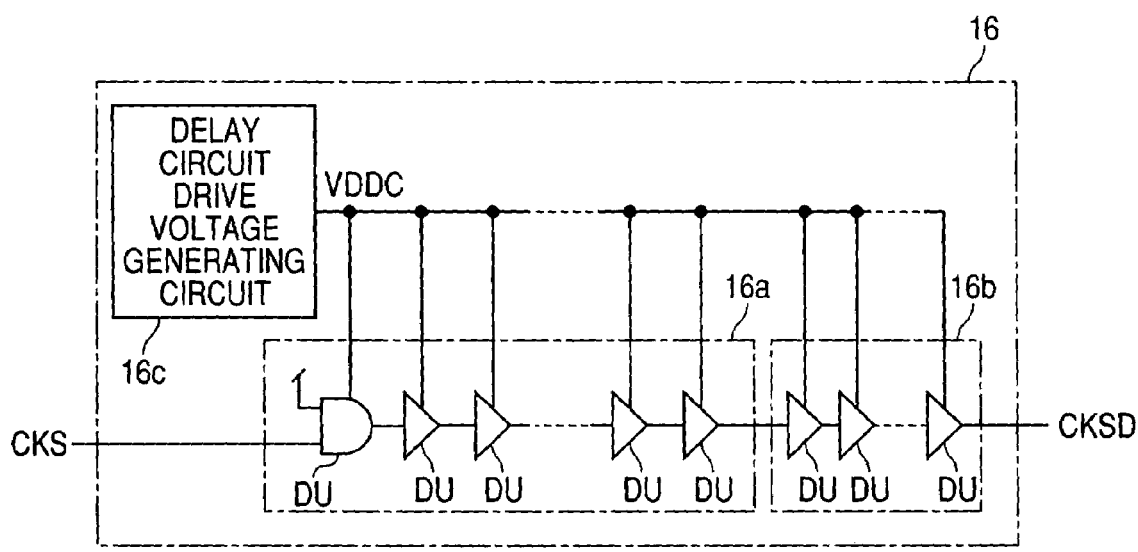
FIG. 2A is a circuit diagram of a delay circuit of the first embodiment and FIG. 2B is a corresponding diagram showing voltage relationships.

FIG. 2A illustrates the circuit configuration of the delay circuit 16. As shown, this is made up of a main delay section 16a that is formed of a plurality of delay units DU connected in series, with each of the delay units having the same operating characteristics as those of the delay units in the pulse delay circuit 10, and an additional delay section 16b which is similarly formed of a plurality of delay units DU, with the initial-stage delay unit of the additional delay section 16b being coupled to receive the output signal produced from the final-stage delay unit of the main delay section 16a. The delay circuit 16 also includes a delay circuit drive voltage generating circuit 16c, which applies a fixed voltage VDDC as a drive voltage (i.e., supply voltage of each of the inverters constituting the delay units DU, as described above) to each of the main delay section 16a and additional delay section 16b. The number of delay units DU constituting the main delay section 16a is identical to that of the pulse delay circuit 10.

Figure 2B:
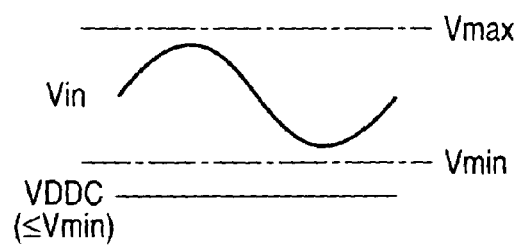

As illustrated in FIG. 2B, the level of the fixed voltage VDDC is set to be lower than the minimum level Vmin that can be attained by the input signal Vin, which varies within a range designated as Vmax to Vmin in FIG. 2B. As a result, each of the delay units DU of the delay circuit 16 is always subjected to a drive voltage that is lower than the drive voltage (Vin) applied to the delay units DU of the pulse delay circuit 10. Hence it is ensured that the amount of delay applied by each of the delay units DU of the delay circuit 16 is greater than the maximum amount of delay that will be applied by each of the delay units DU of the pulse delay circuit 10.

Thus, the overall delay time applied by the main delay section 16a of the delay circuit 16 is always longer than the time required for the pulse signal to perform one circulation around the ring delay line formed by the pulse delay circuit 10 (that time being referred to in the following as the circulation delay interval) irrespective of the level of the input signal Vin.

In this embodiment, the additional delay section 16b is also incorporated in the delay circuit 16, in order to provide a delay margin to ensure that the delay interval of the delay circuit 16 will be longer than the maximum value of the circulation delay interval. However it may be possible to omit the additional delay section 16b.

As an alternative configuration of the delay circuit 16, it would be possible to directly utilize the analog input signal Vin of the pulse delay circuit 10 as the drive voltage (i.e., power supply voltage) VDDC of the delay circuit 16. In that case, it is essential to incorporate the additional delay section 16b.

As a further alternative, a voltage divider circuit could be incorporated, for voltage-dividing the analog input signal Vin, with a resultant output analog input signal being applied as the drive voltage of the delay circuit 16. In that way it can be ensured that the drive voltage of the delay circuit 16 is always lower than the voltage level of the analog input signal Vin.

Referring to the timing diagram of FIG. 3, during each interval (referred to in the following as a pause interval) in which the activation control signal RR is at the low level, circulation of the pulse signal around the pulse delay circuit 10 is inhibited. More specifically, following the start of each pause interval, when the pulse signal subsequently reaches the final-stage delay unit DU of the pulse delay circuit 10 and is thereby inputted to the initial-stage AND gate delay unit, it is inhibited from being outputted to the next stage. In addition, during that interval, the counter initialization signal RC is held at the high level, thereby resetting the circulation counter circuit 13 to an initial count of zero. When the activation control signal RR then goes to the high level, the counter initialization signal RC changes to the low level, so that circulation of a pulse signal in the pulse delay circuit 10 is initiated while at the same time, counting by the circulation counter circuit 13 is enabled. Thereafter, the circulation counter circuit 13 counts in synchronism with the output signal from the final-stage delay unit DU of the pulse delay circuit 10, with that output signal being referred to in the following as the circulation clock signal.

When the next rising edge of the sampling clock signal CKS then occurs, at the end of a sampling interval TS, the output signal states of the delay units DU of the pulse delay circuit 10 become registered in the latch and encoder circuit 11 and are decoded to obtain a set of "a" bits expressing the total number of delay units traversed by the pulse signal following the latest complete circulation of the pulse signal around the delay circuit 16, and constituting the low-order bits of an A/D converted value DT. At the same time, the count value reached by the circulation counter circuit 13 (expressing the total number of circulations performed by the pulse signal during the latest sampling interval TS) is registered in the latch circuit 14, as a set of "b" bits that constitute the high-order bits of the A/D converted value DT, so that DT has m bits, where m=(a+b).

Each A/D converted value DT is thus obtained during each pause interval, in which the activation control signal RR is at the low level and the counter initialization signal RC at the high level, and in which circulation of the pulse signal in the pulse delay circuit 10 is inhibited. Since the duration TR of the pause interval is longer than the circulation delay interval of the pulse delay circuit 10, it is reliably ensured that circulation of a pulse signal in the pulse delay circuit 10 has ceased (i.e., the pulse delay circuit 10 is effectively initialized) before it is again activated when the activation control signal RR returns to the high level.

When each pause interval ends, the above operations are repeated.

Thus with this embodiment, each time a conversion operation is executed to obtain a new A/D converted value DT, both the pulse delay circuit 10 and the circulation counter circuit 13 are initialized during a pause interval. Hence, each A/D converted value DT can be directly utilized as an output data value, without requiring the use of a latch circuit and subtractor circuit for obtaining the difference between a currently obtained numeric value and a precedingly obtained numeric value, as is required with the prior art of reference documents 2 and 3, described hereinabove referring to FIG. 20.

As a result, when the A/D converter is to be implemented as a LSI IC (large-scale integrated circuit), the invention enables total size of chip area that is occupied by the A/D converter circuit to be substantially reduced, by comparison with a TAD type of A/D converter which requires the use of an additional latch circuit and subtractor circuit. Hence the invention enables the manufacturing cost of such an LSI A/D converter to be significantly reduced.

Figure 4:
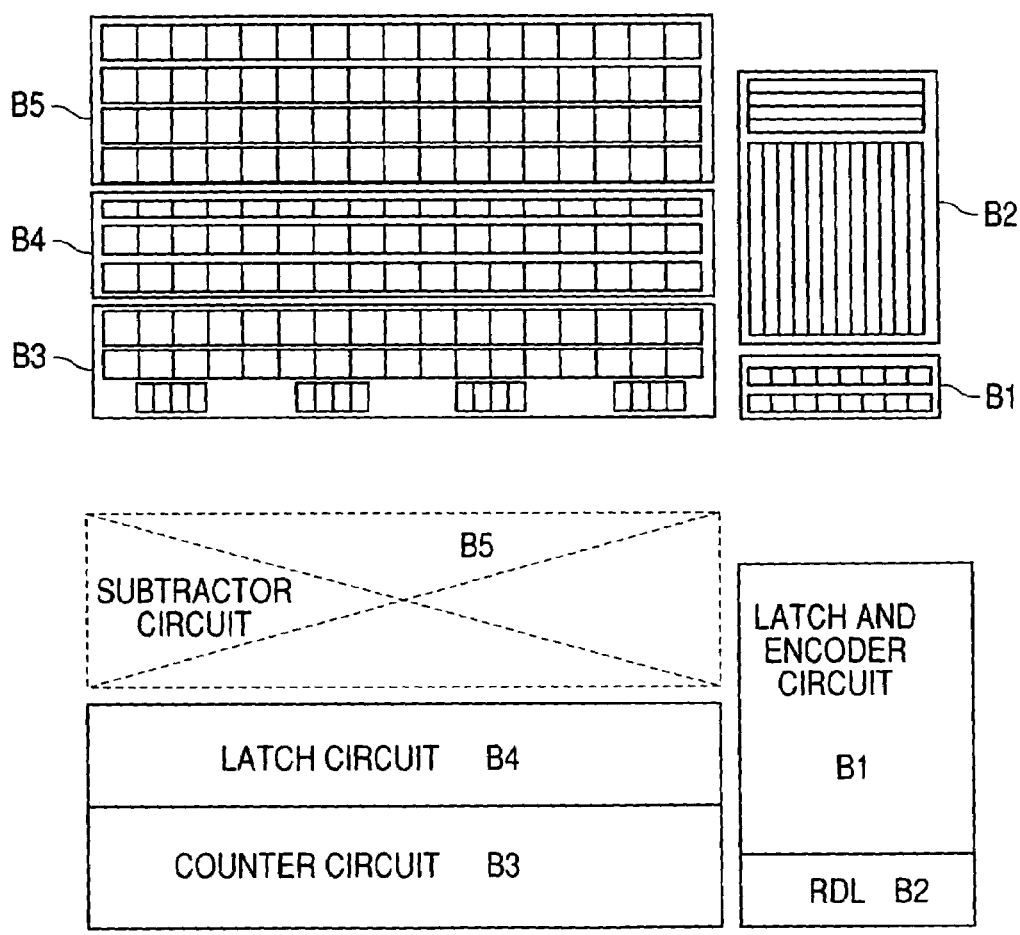
FIG. 4 is an IC pattern diagram for describing the effects obtained when the first embodiment is implemented as an IC.
Figure 20:
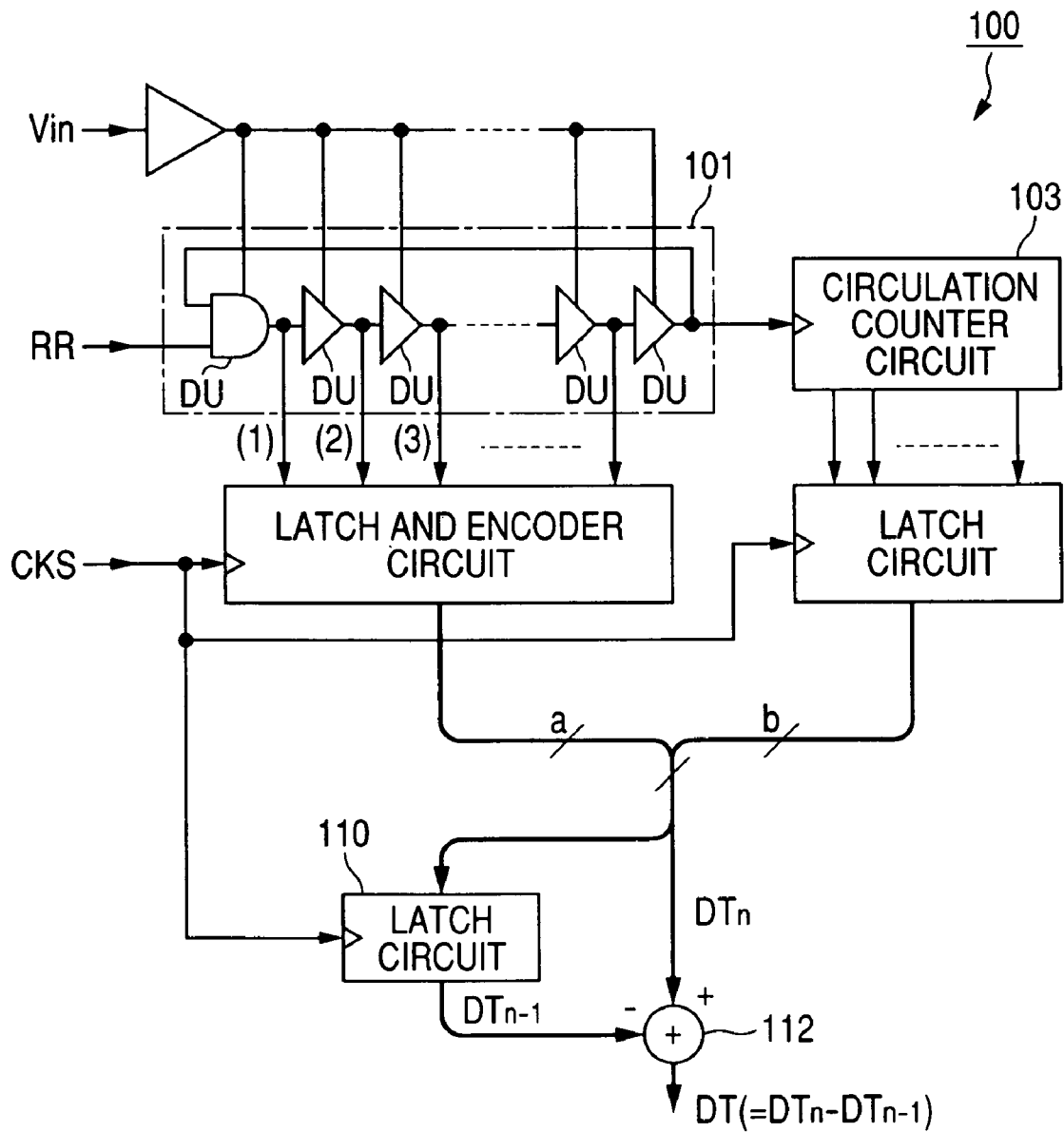
FIG. 20 shows the overall circuit configuration of an example of a prior art A/D converter.
Figure 21:
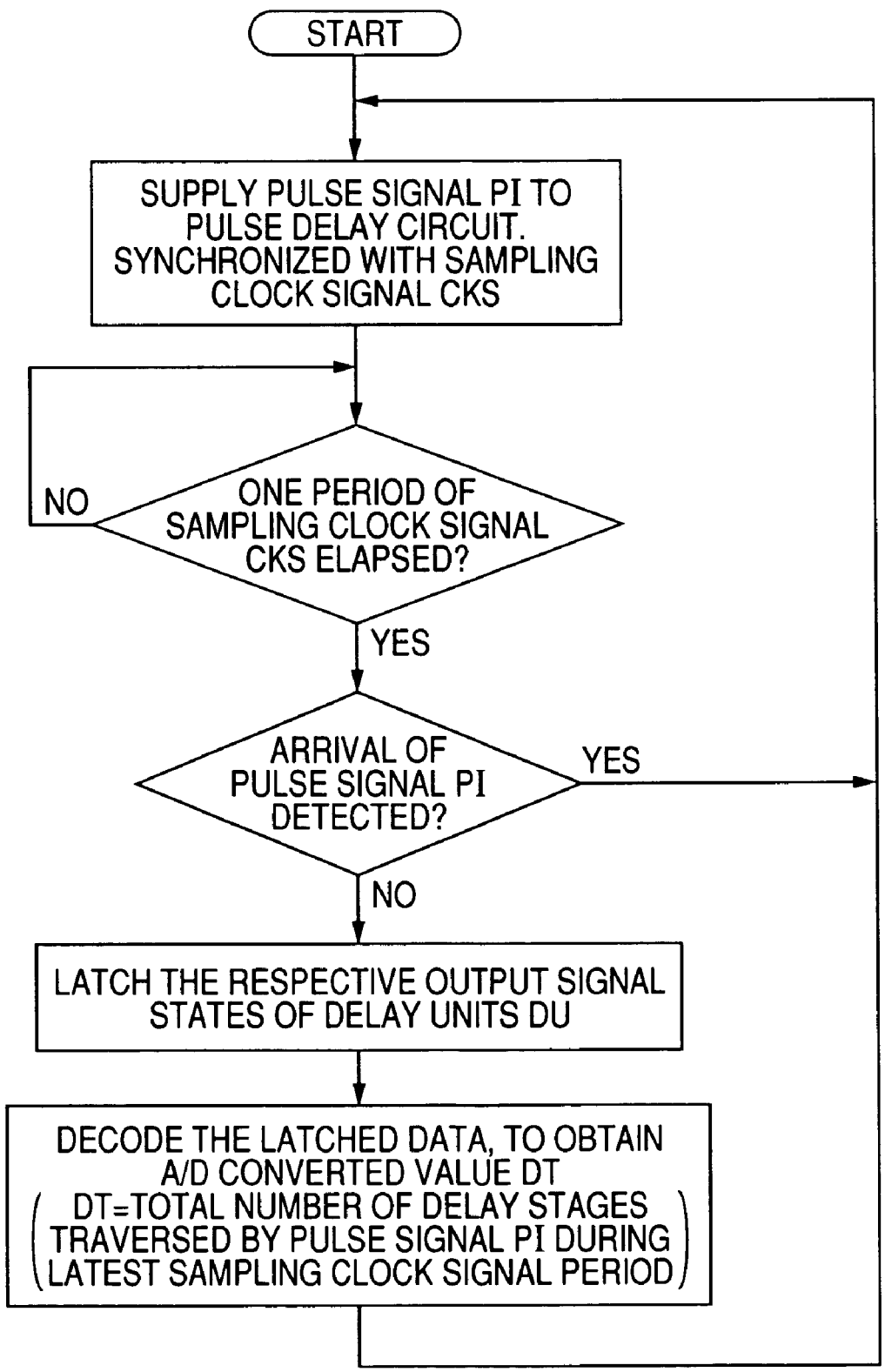
FIG. 21 is a flow diagram of control processing performed with a first form of operation of the seventh embodiment.

This is illustrated in FIG. 4, which shows an example of the layout of a prior art LSI TAD type of A/D converter of the type described referring to FIG. 20. In FIG. 4, B1 is a circuit block that corresponds to the pulse delay circuit 10, B2 is a circuit block corresponds to the latch and encoder circuit 11, B3 is a circuit block corresponds to the circulation counter circuit 13, B4 is a circuit block that corresponds to the latch circuit 14, and B5 is a circuit block that corresponds to a subtractor circuit such as the subtractor 112 in FIG. 20.

As can be understood from FIG. 4, the circuit block B5 for constituting the subtractor circuit occupies approximately 30% of the entire circuit area. If the control signal generating circuit 15 of the above embodiment is utilized in place of the subtractor circuit, then the area occupied by the control signal generating circuit 15 will be substantially identical to that occupied by the pulse delay circuit 10. It can thus be understood that the above embodiment enables the circuit scale to be substantially reduced, thereby enabling the manufacturing cost of such a TAD type of A/D converter to be substantially reduced, when implemented as a LSI.

Moreover as can be understood from the timing diagram of FIG. 3, With the above embodiment, the duration of each pause interval TR is made substantially shorter than the sampling interval T. Hence each interval TS (obtained by subtracting the pause interval TR from the sampling interval T), during which pulse shifting and circulation counting operations are performed, is not significantly reduced as a result of incorporating a pause interval TR in each sampling interval T. As a result, although with this embodiment the pulse delay circuit 10 and the circulation counter circuit 13 are each initialized in each A/D conversion operation, a high speed of conversion can be achieved, which is comparable to that obtained by a prior art type of TAD type of A/D converter in which periodic initialization is not performed, such as that of the prior art example described referring to FIG. 20.

Second Embodiment

Figure 5:
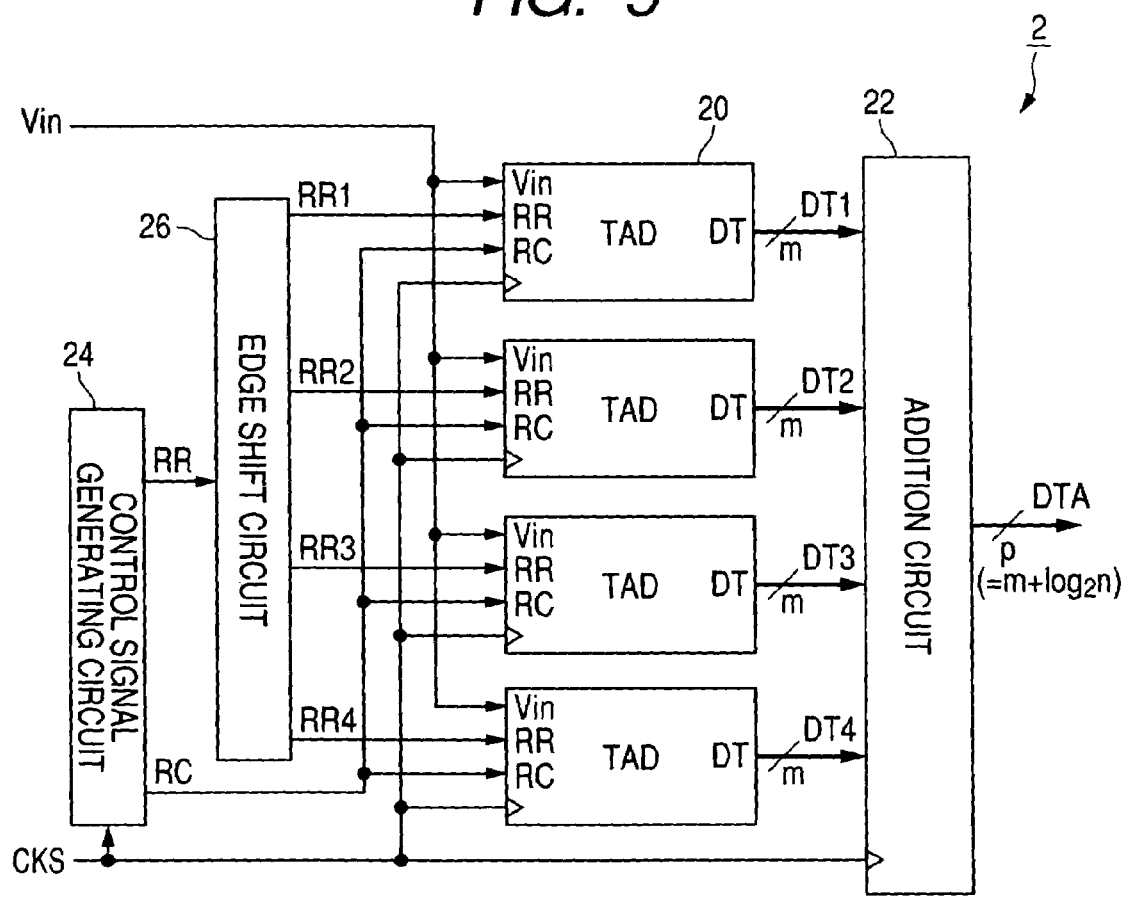
FIG. 5 shows the overall circuit configuration of a second embodiment of an A/D converter.

FIG. 5 shows the general configuration of a second embodiment of a TAD type of A/D converter, designated by reference numeral 2. The A/D converter 2 is based on a plurality of n circuit sections (where n is 4, with this embodiment) referred to in the following as converter core sections 20. Each of the converter core sections 20a is of identical configuration, formed as a TAD module that is made up of the components of the first embodiment shown in FIG. 1 (the pulse delay circuit 10, the latch and encoder circuit 11, the buffer circuit 12, the circulation counter circuit 13, and the latch circuit 14), interconnected as shown in FIG. 1, but with the control signal generating circuit 15 omitted. The input signal Vin and the sampling clock signal CKS are supplied in common to each of the converter core sections

20. The n converter core sections 20 receive respectively in general corresponding individual activation control signals RRi (where, i=1, 2, . . . n), designated as RR1, RR2, RR3, RR4 in FIG. 5. At successive sampling time points determined by the sampling clock signal CKS, the converter core sections 20 derive corresponding m-bit output numeric values DTi in accordance with the level of the input signal Vin, respectively designated as DT1, DT2, DT3, DT4 in the example of FIG. 5.

In the A/D converter 2, each set of respective numeric values DT1, DT2, DT3, DT4 are summed in an addition circuit 22, to obtain an output A/D converted value DTA having p bits (where p=m+log$_2$ n). The A/D converter 2 further includes a control signal generating circuit 24, having a similar function to the control signal generating circuit 15 of the first embodiment, for producing a reference activation control signal RR and a counter initialization signal RC, based on the sampling clock signal CKS. An edge shift circuit 26 operates on the reference activation control signal RR to generate the n individual activation control signals RR1 to RRn corresponding to respective ones of the converter core sections 20.

Figure 6A:
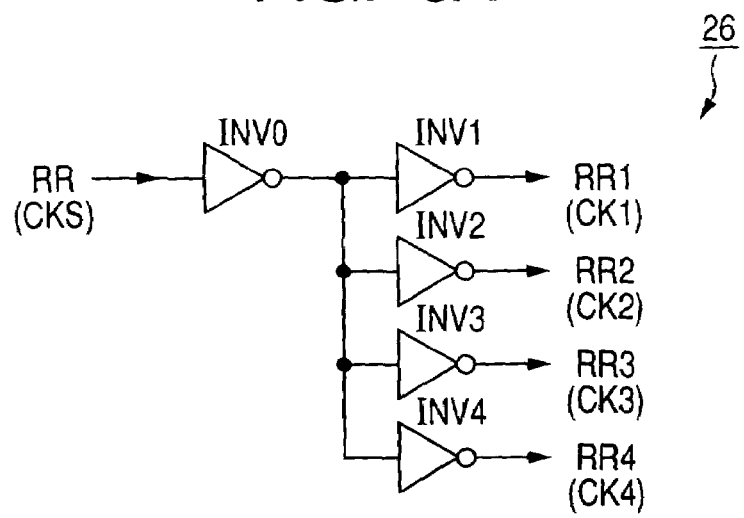
FIG. 6A is a circuit diagram of an edge shift circuit used in the second embodiment.
Figure 6B:
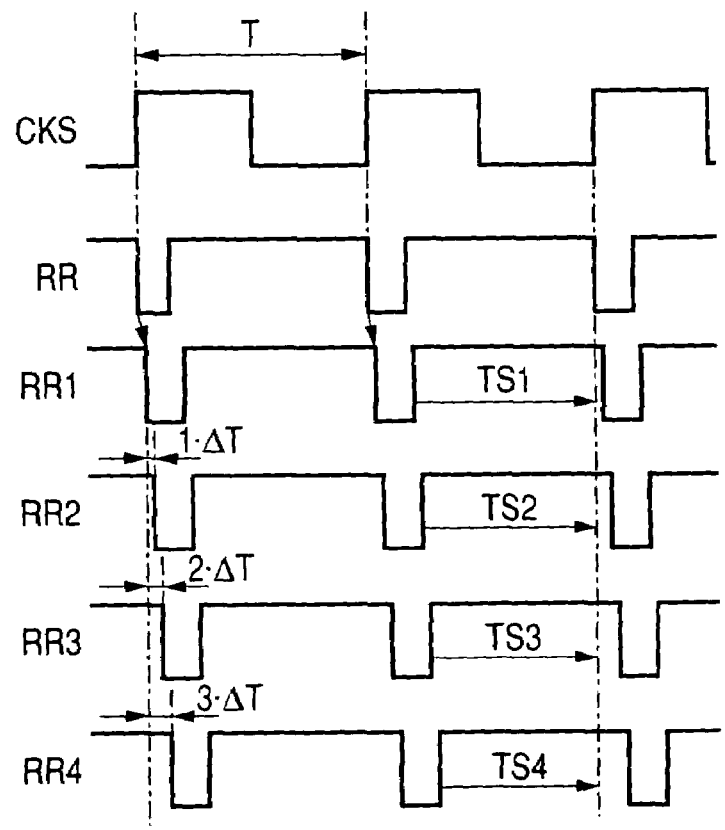
FIG. 6B is a timing diagram for describing the operation of the edge shift circuit.

As shown in FIG. 6A, the edge shift circuit 26 is made up a first-stage inverter INV0 which receives the activation control signal RR, and four (i.e., in the general case, n) second-stage inverters INV1, INV2, INV3, INV4 each of which receives as input signal the output signal from the inverter INV0, and which respectively produce the individual activation control signals RR1, RR2, RR3, RR4. Each of the inverters INV0 to INV4 operates from the analog input signal Vin as a power supply voltage. In the timing diagram of FIG. 6B, a value ΔT is obtained by dividing the delay time Td that is currently being applied by each delay unit of the pulse delay circuit 10 (at the current level of the analog input signal voltage) by the number n of delay stages in the pulse delay circuit 10, (i.e., ΔT=Td/n), so that ΔT is obtained as Td/4 with this embodiment. As shown in FIG. 6B, the inverters INV1, INV2, INV3, INV4 generate the corresponding activation control signals RR1, RR2, RR3, RR4 with successively increasing amounts of phase delay, i.e., ΔT, 2ΔT, 3ΔT, 4ΔT. In the general case, the delay applied by the i-th inverter is (i×ΔT).

Figure 7:
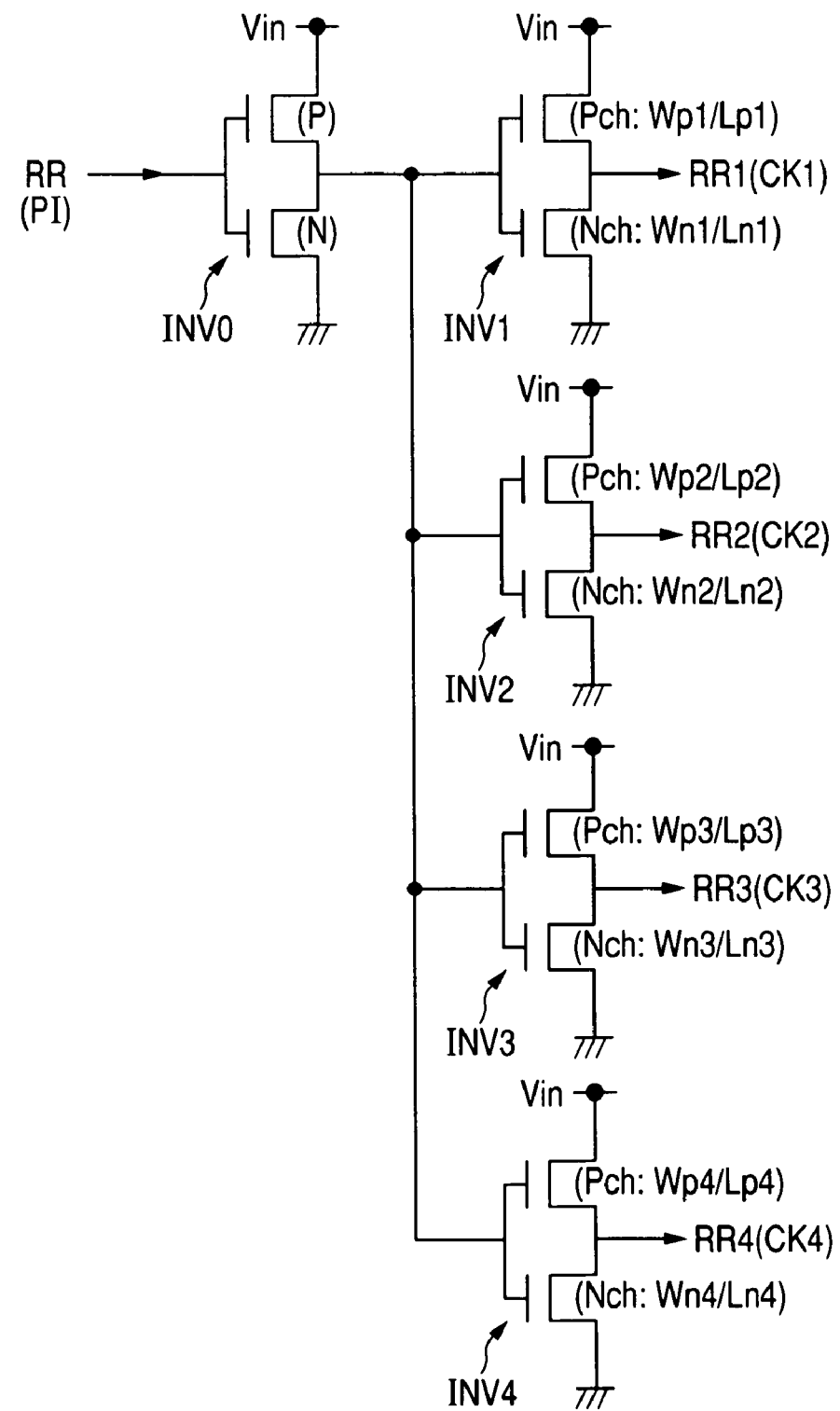
FIG. 7 shows details of the configuration of the edge shift circuit.

The circuit configuration of the edge shift circuit 26 is shown in more detail in FIG. 7. In particular, each of the second-stage inverters INV1, INV2, INV3, INV4 is formed of a P-channel FET and a N-channel FET, and the respective amounts of delay produced by these inverters are determined at the stage of manufacture, by appropriately adjusting the respective gate electrode widths Wp, Wn and transistor lengths Lp, Ln of the FETs of each inverter.

With this embodiment, each of the converter core sections 20 operates in the same manner as the A/D converter 1 of the first embodiment, with respect to the sampling clock signal CKS and the corresponding one of the activation control signals RR1, RR2, RR3, RR4. As shown in FIG. 6B, each rising edge of an individual activation control signal corresponding to a specific one of the converter core sections 20 constitutes an activation time point at which a pulse signal is initiated in the pulse delay circuit 10 of that converter core section. In the i-th converter core section, an individual measurement interval TSi then elapses, which extends to the next rising edge of the sampling clock signal CKS. During that measurement interval TSi, the i-th converter core section measures the total number of delay stages that are traversed by the pulse signal in the pulse delay circuit 10 of that converter core section. At the end of that measurement interval, the converter core section outputs a resultant numeric value DTi, derived as described for the output data values DT of the first embodiment.

Hence, although each of the converter core sections 20 operates on the same input signal Vin, due to the respectively different durations of their individual measurement intervals TSi, they generate respectively different output numeric values DTi in each period of the sampling clock signal CKS. Alternatively stated, due to their individual activation time points (i.e., each rising edge of the corresponding activation control signal RRi) successively differing by the unit time amount ΔT, the respective conversion characteristics of the converter core sections 20, in converting the input signal Vin to numeric values DTi, are successively shifted with respect to one another by the amount Vd/n, where Vd is an amount of change of the input signal Vin that corresponds to the LSB of a numeric value DTi.

That is to say, with n delay stages in each converter core section, an amount of change in the level of the input signal Vin that will result in a change in state of the LSB of the output A/D converted data from the addition circuit 52 corresponds to 1/n times the amount of change in Vin that will result in a change in state of the LSB of the numeric values generated by one of the converter core sections 20.

In that way, the resolution of the output A/D converted data DTA is increased by an amount equal to the number of increased bits (log$_2$ n) in the output data DTA that result from the summing operation.

As can be understood from the above description, with this embodiment in addition to the results that can be achieved by the A/D converter 1 of the first embodiment, increased resolution of A/D conversion can be achieved.

Third Embodiment

Figure 8A:
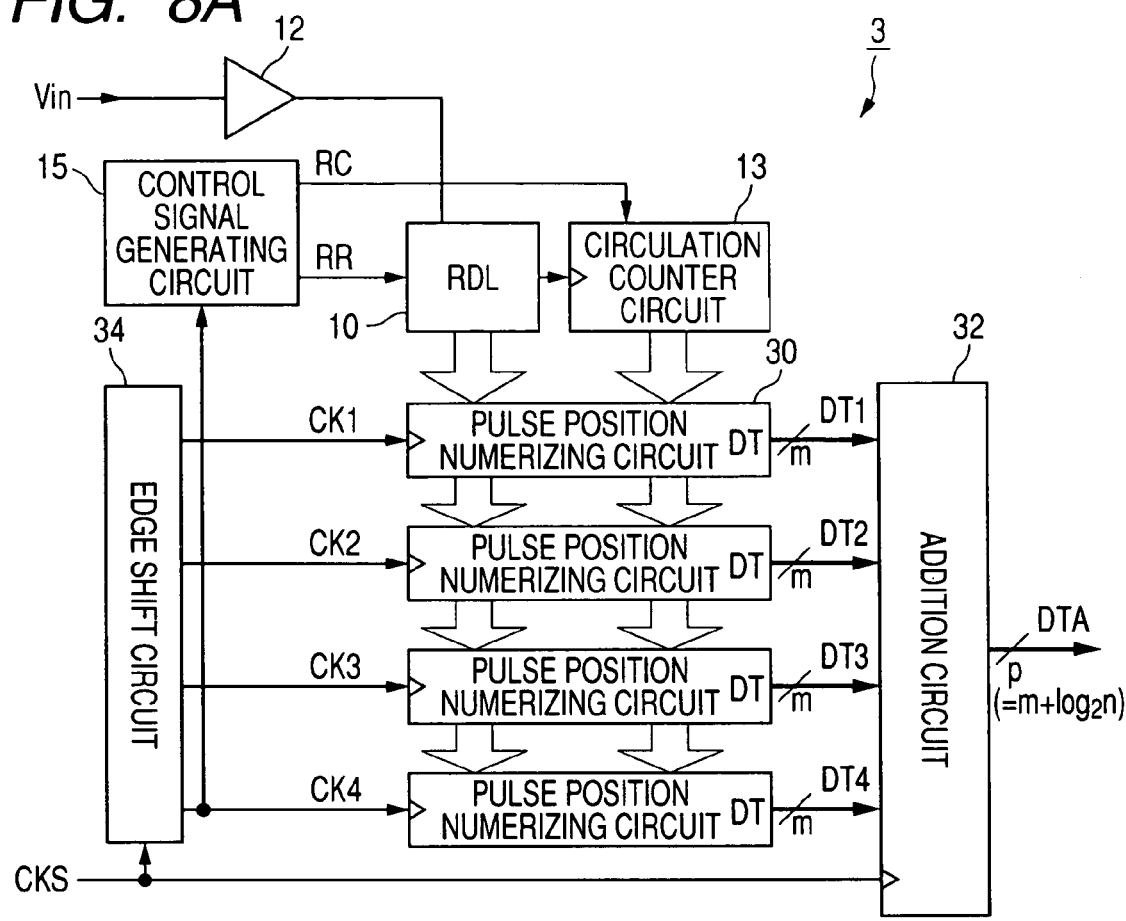
FIG. 8A shows the overall circuit configuration of a third embodiment of an A/D converter.
Figure 8B:
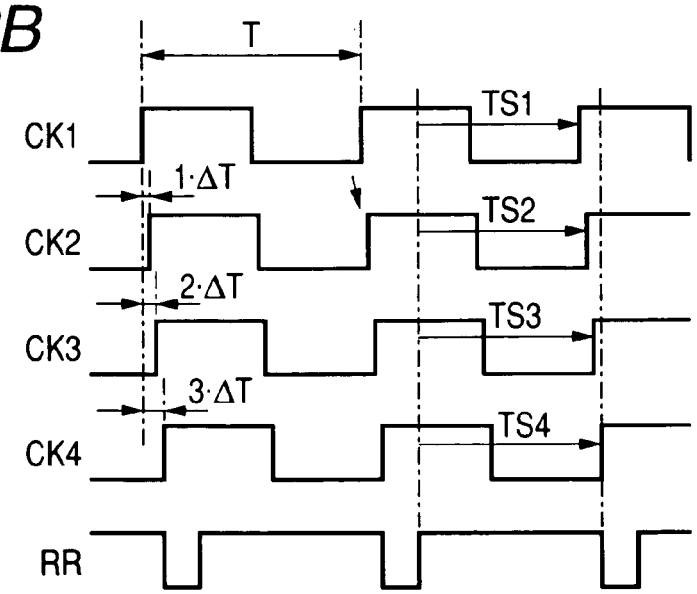
FIG. 8B is a timing diagram for describing the operation of the third embodiment.

FIG. 8A shows the general configuration of a third embodiment of a TAD type of A/D converter, designated by reference numeral 3. FIG. 8B is a timing diagram for describing the operation of this embodiment. As shown, the A/D converter 3 includes a pulse delay circuit 10, buffer circuit 12, a circulation counter circuit 13, and a control signal generating circuit 15, which each correspond in function to the identically numbered sections of the first embodiment. In addition, the A/D converter 3 includes a set of n pulse position numerizing circuits 30 (where n is an integer, which is 4 in this embodiment). Each of the pulse position numerizing circuits 30 is configured as described for the combination of the latch and encoder circuit 11 and latch circuit 14 of the first embodiment, and generates successive m-bit numeric values DTi (wherein i=1, 2, . . . , n).

Each of the pulse position numerizing circuits 30 receives a corresponding one of a set of n individual sampling clock signals, i.e., with the i-th one of the pulse position numerizing circuits 30 receiving the i-th sampling clock signal. In this embodiment, in which n is 4, the four individual sampling clock signals are respectively designated as CK1, CK2, CK3, CK4. Each of the pulse position numerizing circuits 30 outputs successive numeric values DTi at respective sampling time points determined by the corresponding one of the sampling clock signals (in this embodiment, at each rising edge of the corresponding sampling clock signal). More specifically, each such numeric value DTi begins to be outputted from the latch circuits 11, 14 of the i-th pulse position numerizing circuit following a sampling time point that is determined by the corresponding sampling clock signal CKi.

The A/D converter 3 further includes an addition circuit 32, which sums each set of numeric values DT1 to DTn respectively produced from the pulse position numerizing circuits 30, to obtain an A/D converted output data value DTA, having p bits (where p=m+log$_2$ n).

The individual sampling clock signals CK1 to CKn are generated by an edge shift circuit 34, which is configured to operates on an input sampling clock signal CKS in the same way as described for the edge shift circuit 26 of the second embodiment with respect to the activation control signal RR that is supplied thereto.

The control signal generating circuit 15 of this embodiment receives as input the sampling clock signal CKSn of the n-th one of the individual sampling clock signals that are generated by the edge shift circuit 34, i.e., the individual sampling clock signal having the greatest amount of delay.

The pulse delay circuit 10, the buffer circuit 12, the circulation counter circuit 13 and the control signal generating circuit 15 of this embodiment each operate in the same manner as for the correspondingly numbered section of the first embodiment, however each of the pulse position numerizing circuits 30 receives a corresponding one of the individual sampling clock signals that are produced by the edge shift circuit 34, and operates in accordance with that individual sampling clock signal.

More specifically, each rising edge of the activation control signal RR defines an activation time point at which a pulse signal begins to traverse the pulse delay circuit 10, and from which respective individual measurement intervals TSi (i=1, 2, . . . , n) of the pulse position numerizing circuits 30 each begin, as illustrated in the timing diagram of FIG. 8B. As shown, each of the individual measurement intervals ends at the next rising edge of the corresponding individual sampling clock signal CKi. At the end of each individual measurement interval, the corresponding one of the pulse position numerizing circuits 30 derives a numeric value expressing the total number of delay units of the pulse delay circuit 10 that have been traversed by the pulse signal during that measurement interval, and the resultant numeric values DTi from the pulse position numerizing circuits 30 are added together in the addition circuit 32, to obtain an output A/D converted value DTA.

Due to the respectively different lengths of the measurement intervals TSi, in the same way as described for the second embodiment, the resolution and the dynamic range of the output converted data are each increased by comparison with those of the numeric value data DTi, with the resolution being increased by an amount equal to the number of increased bits (log$_2$ n) in each A/D converted data value DTA resulting from the summing operation.

Hence with the A/D converter 3 of this embodiment, due to the fact that each of the pulse position numerizing circuits 30 utilizes the same pulse delay circuit 10 and circulation counter circuit 13 in common, the same advantages and effects can be obtained as for the A/D converter 2 of the first embodiment, but enabling the circuit scale to be reduced.

Fourth Embodiment

Figure 9:
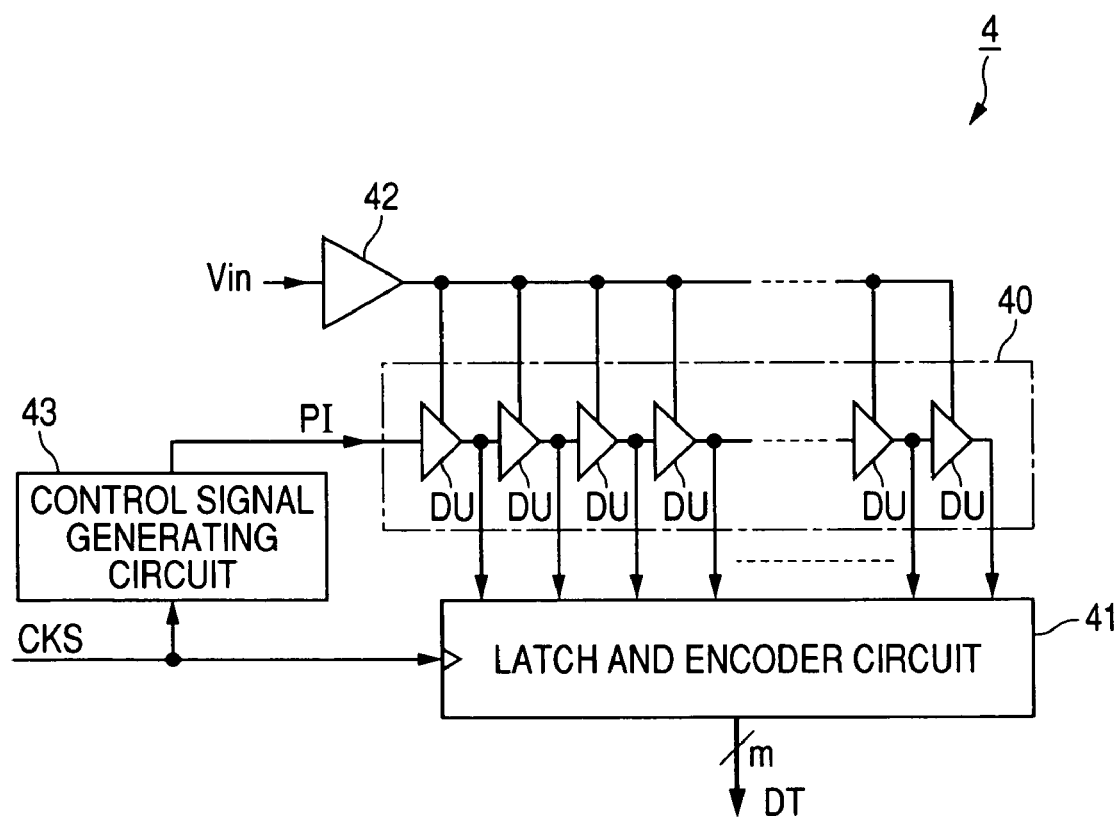
FIG. 9 shows the overall circuit configuration of a fourth embodiment of an A/D converter.

A fourth embodiment will be described referring to FIG. 9. This embodiment is an A/D converter 4, in which a pulse delay circuit 40, a latch and encoder circuit 41 and a buffer circuit 42 respectively correspond in function and operation to the pulse delay circuit 10, latch and encoder circuit 11 and buffer circuit 12 of the first embodiment. The pulse delay circuit 40 is made up of a M delay units DU (where M is an integer) connected in series as respective delay stages. However with this embodiment, the pulse delay circuit 40 is configured as a straight delay line. At each of respective sampling time points defined by the externally supplied sampling clock signal CKS, the latch and encoder circuit 41 registers the respective output signals from the delay units DU of the pulse delay circuit 40, to detect the position reached by a pulse signal PI, which is periodically supplied to the first-stage delay unit DU as the activation signal of this embodiment, from a control signal generating circuit 42).

The latch and encoder circuit 41 thereby detects the total number of delay stages traversed by the pulse signal, and then generates a m-bit output A/D converted value based on the detection results, where m=[log$_2$ M], [x]. Here, "x" denotes a number of bits below the radix point that are rounded up.

The control signal generating circuit 42 is a frequency divider circuit which performs frequency division of the sampling clock signal CKS by a factor 1/k (where k is an integer equal to 2 or greater), so that the period of the activation signal PI is k times the sampling period TS.

In the same way as described for the first embodiment, the total number of delay units successively traversed by the pulse signal within a fixed time interval varies in accordance with the voltage level of the analog input signal Vin.

The minimum delay time before the pulse signal is outputted from the final stage delay unit DU of the pulse delay circuit 40 after having been inputted to the first-stage delay unit DU will be referred to as the lower limit delay interval DLYmin, which occurs when the analog input signal Vin is at an upper limit value Vmax of the allowable range of voltage levels (Vmin-Vmax). The maximum delay time before the pulse signal is outputted from the final stage delay unit DU of the pulse delay circuit 40 after having been inputted to the first-stage delay unit DU will be referred to as the upper limit delay interval DLYmin, which occurs when the analog input signal Vin is at the lower limit value Vmin of the predetermined range.

The period TS of the sampling clock signal CKS (which in this embodiment is equal to the measurement interval) is predetermined to be shorter than the lower limit delay time DLYmin. In addition, the period of the activation signal PI (k×TS) is made longer than the upper limit delay time DLYmax. With this embodiment, k is 2.

Figure 10:
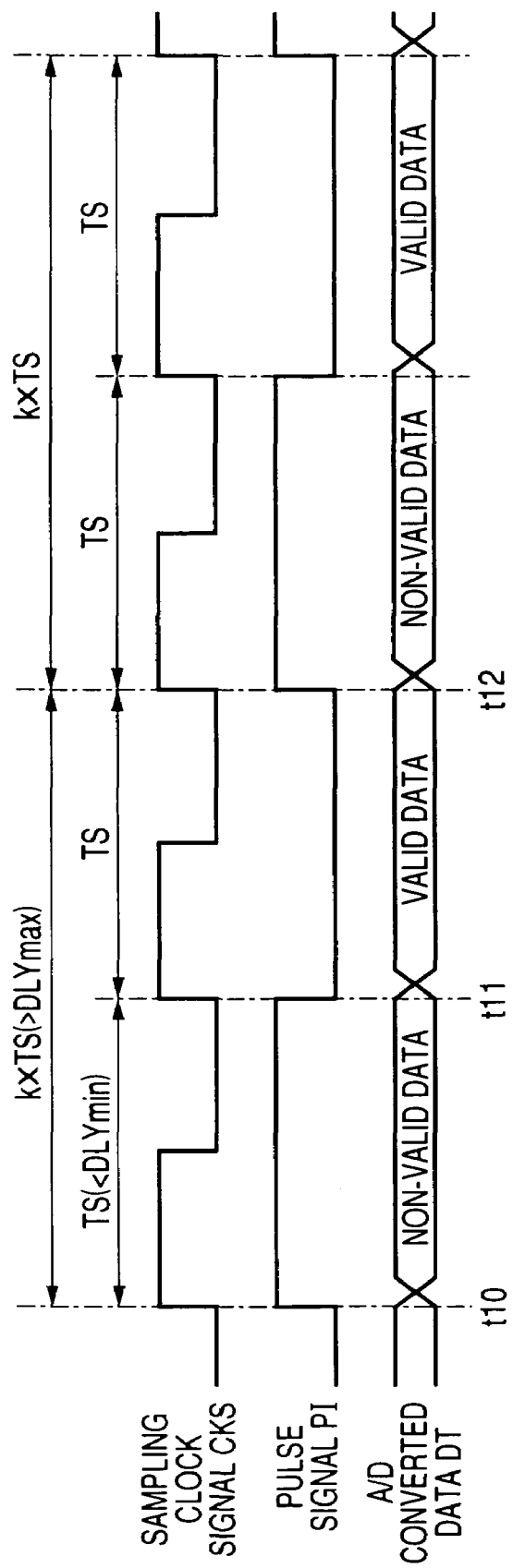
FIG. 10 is a timing diagram for describing the operation of the fourth embodiment.

As shown in the timing diagram of FIG. 10 after the pulse delay circuit 40 has been activated (e.g., at time point t10), then at the next sampling time point (t11), the output signals from the pulse delay circuit 40 are latched by the latch and encoder circuit 41. If at that time the analog input signal Vin is within the allowable range of voltage variation, the pulse signal that was activated at the preceding activation time point/sampling time point (t10) will not yet have reached the final-stage one of the delay units DU. Hence, the m bits of digital data derived at that time by the latch and encoder circuit 41 are outputted as a valid output A/D converted value DT.

At the next sampling time point (t12), the pulse delay circuit 40 is again activated. If at that time the analog input signal Vin is within the allowable range of voltage variation, then the pulse signal that was inputted at the preceding activation/sampling time point (t10) will have already reached the output of the final-stage delay unit DU. Thus, the pulse delay circuit 40 will have returned to the initialized state (i.e., with no pulse signal currently traversing the delay units DU). At that time point, the output signals from the pulse delay circuit 40 are again latched by the latch and encoder circuit 41, and a corresponding digital value DT is outputted from the latch and encoder circuit 41. However, this is handled as non-valid data. In addition, at that time point (t12), the pulse delay circuit 40 is again activated.

The above series of operations are successively repeated. Hence, with this example in which k is 2, a new output A/D converted value DT is obtained once in every two successive periods of the sampling clock signal CKS (i.e., once in each period of the activation signal PI). It can be understood that with this embodiment, it is reliably ensured that the pulse delay circuit 40 is in the initialized condition at the start of each measurement interval, without it being necessary to perform any specific operations for initializing the pulse delay circuit 40. Hence, high-speed continuous A/D conversion can be achieved with a simple circuit configuration, since it is not necessary to incorporate a circuit for initializing the pulse delay circuit 40 or for detecting whether initialization of the pulse delay circuit 40 has been completed.

Furthermore with the A/D converter 4 of this embodiment, since the control signal generating circuit 42 need only perform frequency division of the sampling clock signal CKS, it can be implemented as a simple circuit, so that the overall circuit scale of the A/D converter can be further reduced.

Fifth Embodiment

Figure 11A:
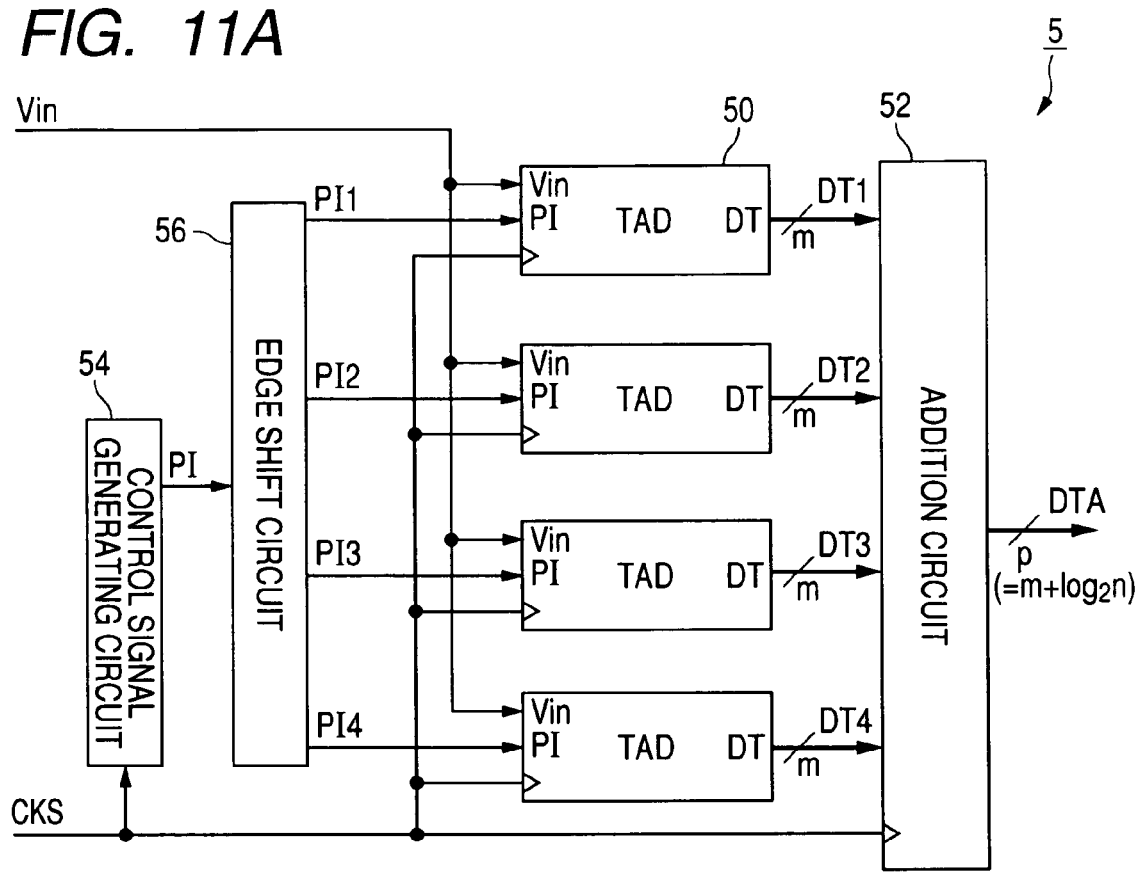
FIG. 11A shows the overall circuit configuration of a fifth embodiment of an A/D converter.
Figure 11B:
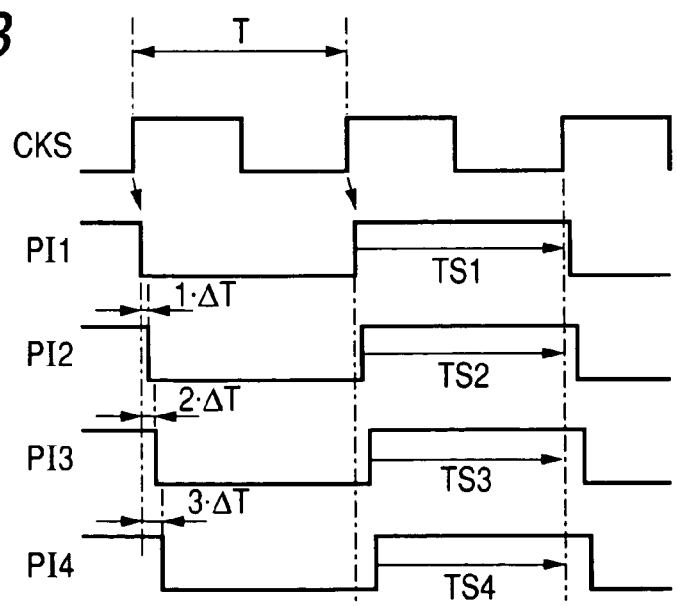
FIG. 11B is a timing diagram for describing the operation of the fifth embodiment.

FIG. 11 shows the general configuration of a fifth embodiment of a TAD type of A/D converter, designated by reference numeral 5. The A/D converter 5 is based on a plurality of n converter core sections 50 (where n is 4, with this embodiment). Apart from the control signal generating circuit 42 being omitted, each of the converter core sections 20a is a TAD module that is made up of the components of the fourth embodiment (the pulse delay circuit 40, the latch and encoder circuit 41 and the buffer circuit 42), interconnected as shown in FIG. 9.

The analog input signal Vin and the externally supplied sampling clock signal CKS are supplied in common to each of the converter core sections 50.

The n converter core sections 50 receive respectively corresponding individual activation signals PIi (where in general, i=1, 2, ... n, where n is 4 with this embodiment), respectively designated as PI1, PI2, PI3, PI4 in FIG. 5. At each of successive sampling time points determined by the sampling clock signal CKS, the converter core sections 50 derive corresponding m-bit output numeric values DTi in accordance with the level of the input signal Vin, with these numeric values respectively designated as DT1, DT2, DT3, DT4 in FIG. 5.

Each set of respective numeric values DT1 to DTn are summed in an addition circuit 52, to obtain an output A/D converted value DTA having p bits (where $p=m+\log_2 n$). The A/D converter 5 further includes a control signal generating circuit 54 for producing a reference activation signal PI based on the sampling clock signal CKS that is supplied to an edge shift circuit 56. The edge shift circuit 56 produces the n individual activation signals PI1 to PIn (with this embodiment, PI1, PI2, PI3, PI4) for the converter core sections 50, based on the reference activation signal PI.

Figure 15A:
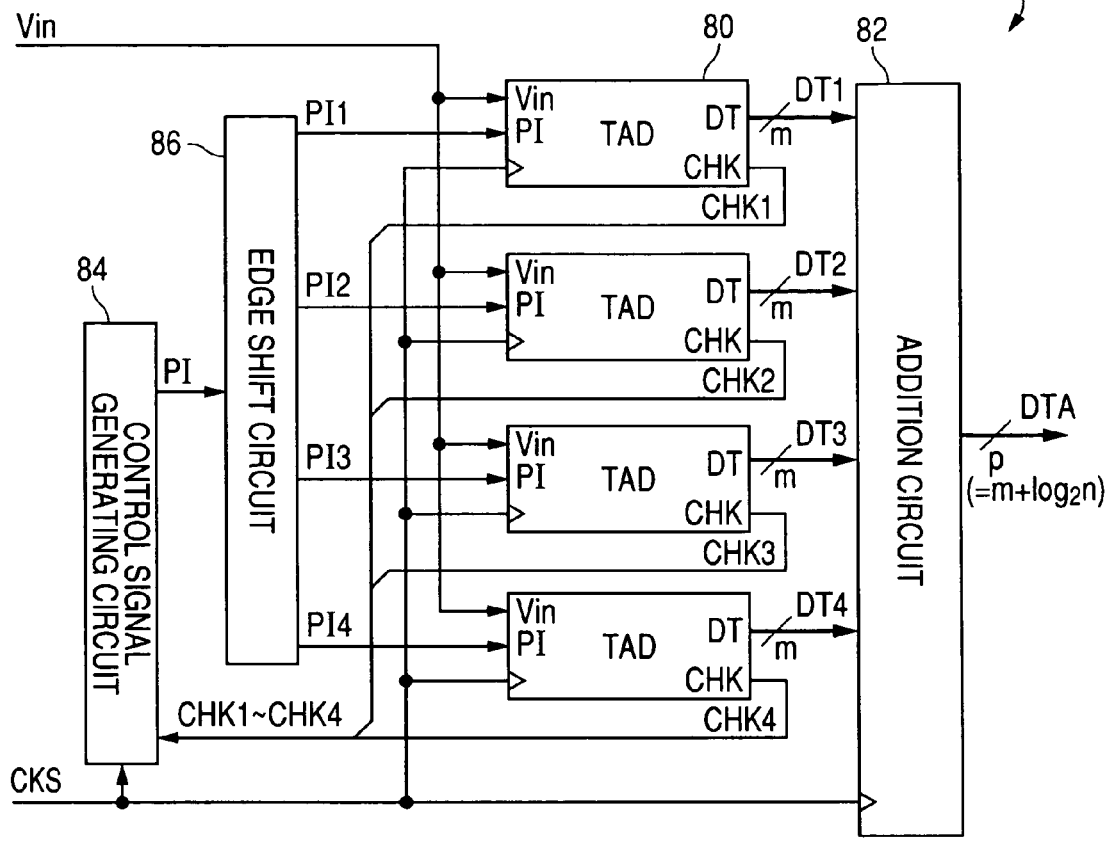
FIG. 15A shows the overall circuit configuration of a eighth embodiment of an A/D converter.
Figure 15B:
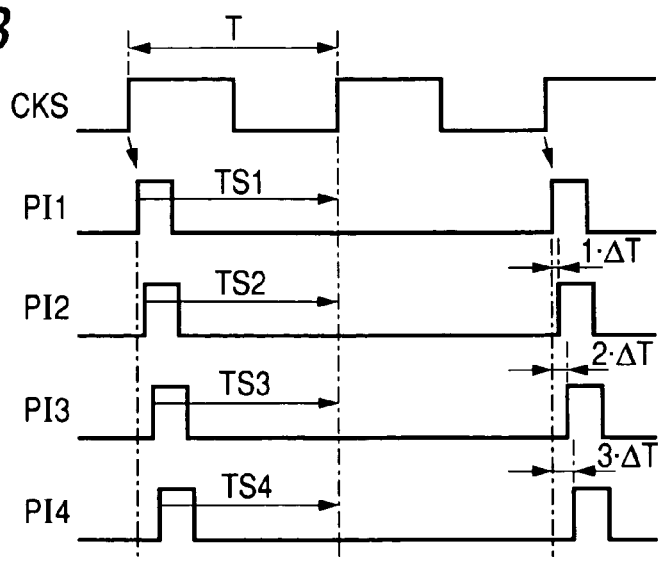
FIG. 15B is a timing diagram for describing the operation of the eighth embodiment.

As shown in FIG. 15B, the edge shift circuit 56 generates the individual activation signals PI1 to PIn (PI1, PI2, PI3, PI4 with this embodiment) with successively differing amounts of delay, i.e., with the delay applied to the i-th inverter being (i×ΔT), where ΔT is a unit delay amount that is determined in accordance with current amount of delay being applied by each of the delay units in each converter core section, as described hereinabove for the second embodiment shown in FIG. 5. The edge shift circuit 56 can be configured and operate as described for the edge shift circuit 26 of the second embodiment.

Due to the varying amounts of phase shift applied to the individual activation signals PI1 to PIn, the converter core sections 50 have respectively different durations of measurement interval, as illustrated in FIG. 15B, in which the four individual activation signals PI1, PI2, PI3, PI4 define respective measurement intervals TS1 to TS4. Due to the respectively different measurement intervals, correspondingly different numeric values DT1 to DTn will be derived by the converter core sections 50, for the same voltage level of the analog input signal Vin.

As a result of summing the respective numeric values DT1 to DTn that are produced from the converter core sections 50, to obtain each output A/D converted value DTA from the addition circuit 60, the resolution of the output A/D converter data is increased accordingly, as described for the second embodiment. That is to say, the resolution is increased by an amount equal to the number of increased bits ($\log_2 n$) in each output A/D converted value DTA, resulting from the summing operation.

Specifically, with n equal to 4, the LSB of an output A/D converted value DTA from the addition circuit 52 corresponds to ¼ of an LSB of one of the converter core sections 50 (i.e., in terms of the equivalent amount of change in level of the analog input signal Vin).

It can thus be understood that this embodiment provides similar advantages to those of the fourth embodiment, while also enabling the resolution of D/A conversion to be increased as required, by increasing the value of n.

Sixth Embodiment

Figure 12A:
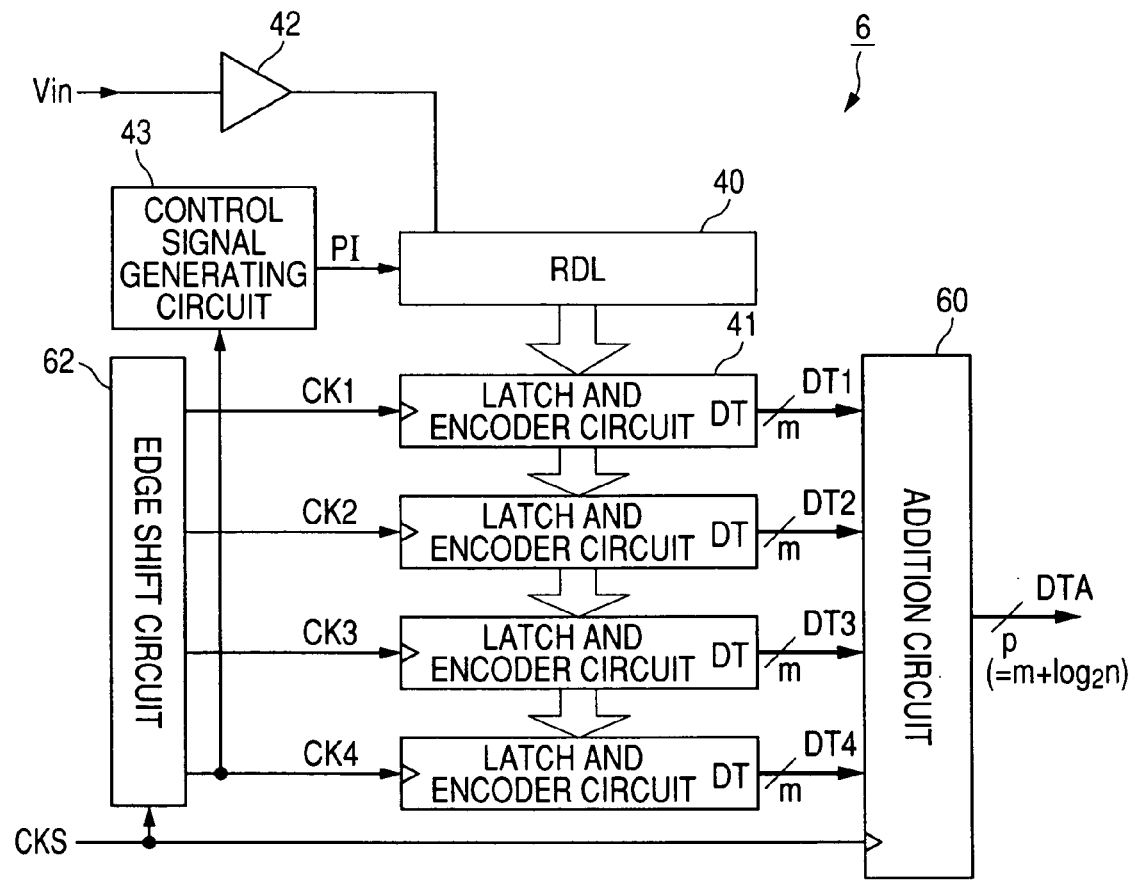
FIG. 12A shows the overall circuit configuration of a sixth embodiment of an A/D converter.

A sixth embodiment will be described referring to the system block diagram of FIG. 12A and the corresponding timing diagram of FIG. 12B. This embodiment is an A/D converter 6 in which a pulse delay circuit 40, a buffer circuit 42 and a control signal generating circuit 42 are interconnected and function in the same manner as described for the correspondingly numbered sections of the A/D converter 4 of FIG. 9. However with this embodiment, a set of n latch and decoder circuits 41 (where n is an integer equal to 2 or greater, and is 4 in this embodiment) are connected in common to receive the output signals from the delay units DU of the pulse delay circuit 40, in place of the single latch and encoder circuit 41 of the fourth embodiment shown in FIG. 9.

Each of the n latch and decoder circuits 41 receives a corresponding one of a set of n individual sampling clock signals CK1 to CKn that are produced from an edge shift circuit 62 (i.e., with the i-th latch and encoder circuit 41 receiving the individual pulse signal PIi, where i=1, 2, ..., n). The edge shift circuit 62 operates based on the analog input signal Vin and an externally supplied reference sampling clock signal CKS, as described for the preceding embodiments. The reference sampling clock signal CKS is also supplied to an addition circuit 60. The addition circuit 60 functions in the same manner as the addition circuit 52 of the fifth embodiment, to add together each of a set of n numeric values DT1 to DTn (each having m bits) that are periodically produced from the latch and decoder circuits 41, to obtain an A/D converted output value DTA having p bits (where $p=m+\log_2 n$).

Figure 12B:
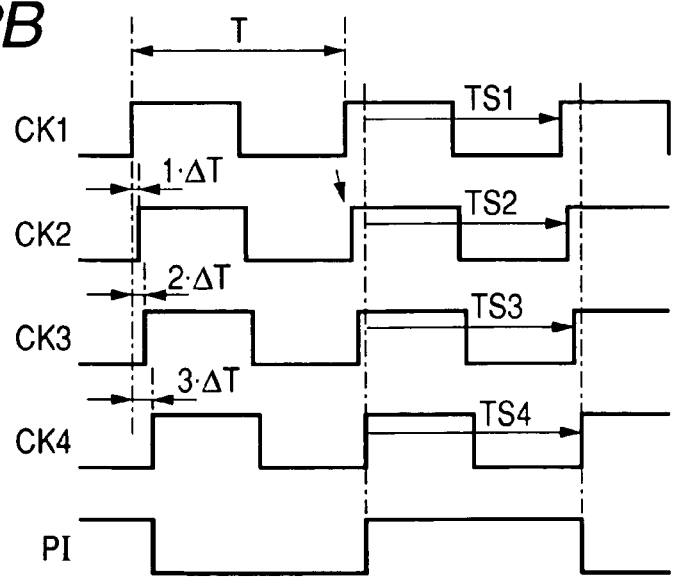
FIG. 12B is a timing diagram for describing the operation of the sixth embodiment.

As illustrated in FIG. 12B, in response to the reference sampling clock signal CKS, the edge shift circuit 62 generates the n individual sampling clock signal CK1 to CKn such that these are successively shifted in phase from one another, by an identical unit time amount ΔT, which is determined by dividing the amount of delay currently being applied by each of the delay units of the pulse delay circuit 40 by n, as described in detail above for the edge shift circuit 26 of the second embodiment, i.e., with these individual sampling clock signal CK1 to CKn having successively increasing amounts of phase delay.

With this embodiment as shown in FIG. 12B, the measurement interval TSi of the i-th one of the latch and decoder circuits 41 commences from a rising edge of the activation signal (pulse signal) PIi produced from the control signal generating circuit 42, and continues until the next rising edge of the corresponding one of the n individual sampling clock signals CK1 to CKn. During the measurement interval, the total number of delay units DU in the pulse delay circuit 40 that have been traversed by the pulse signal is obtained and a corresponding numeric value DTi is derived therefrom and is outputted by that one of the latch and decoder circuits 41 to the addition circuit 52. Due to the respectively different measurement intervals of the latch and decoder circuits 41, correspondingly different numeric values DT1 to DTn will be derived by the latch and decoder circuits 41, for the same voltage level of the analog input signal Vin.

As a result of summing each set of respective numeric values DT1 to DTn produced from the latch and decoder circuits 41, to obtain each output A/D converted value DTA from the addition circuit 60, the resolution of the output A/D converter data is increased accordingly, for the same reasons as described for the A/D converter 3 of the third embodiment shown in FIG. 8A, i.e., the resolution is increased by an amount equal to the number of increased bits ($\log_2$ n) in each output A/D converted value DTA, resulting from the summing operation.

It can thus be understood that this embodiment provides similar advantages to those of the fifth embodiment described above, while moreover enabling the overall circuit scale of the A/D converter to be reduced, This is due to the fact that instead of utilizing a plurality of converter core sections (TAD modules) as for the fifth embodiment, the sixth embodiment utilizes a plurality of latch and decoder circuits 41 which operate in common from one pulse delay circuit 40.

Seventh Embodiment

A seventh embodiment will be described referring to FIG. 13. This embodiment is an A/D converter 7, in which a pulse delay circuit 70, a latch and encoder circuit 71 and a buffer circuit 72 respectively correspond in function and operation to the pulse delay circuit 40, latch and encoder circuit 41 and buffer circuit 42 of the fourth embodiment described above, with the pulse delay circuit 70 configured as a straight delay line made up of a M delay units DU (where M is an integer equal to 2 or greater) connected in series as respective delay stages. At each of respective sampling time points defined by the externally supplied sampling clock signal CKS, the latch and encoder circuit 71 registers the respective output signals from the delay units DU of the pulse delay circuit 40, to detect the position reached by a pulse signal PI (i.e., number of delay units successively traversed) during a fixed-duration measurement interval, to obtain a value proportional to the voltage level of the input signal Vin. The latch and encoder circuit 41 thereby generates a m-bit output A/D converted value based on the detection results, where m=[$\log_2$ M], [x]. Here, "x" denotes a number of bits below the radix point that are rounded up.

With this embodiment, the activation signal PI is a short-duration pulse that is supplied from a control signal generating circuit 74, and the embodiment further includes an arrival detection circuit 73 which monitors the output of the final-stage delay unit DU of the pulse delay circuit 70. Specifically, the arrival detection circuit 73 detects each time the pulse signal PI reaches the final-stage delay unit DU (e.g. when, the output signal from that delay unit changes from the low to the high level). When such a time point is reached, the arrival detection circuit 73 inverts the level of an output signal CHK (referred to in the following as an arrival detection signal). The arrival detection circuit 73 can be implemented simply as a toggle-type flip-flop. The arrival detection signal CHK is supplied to the control signal generating circuit 74, together with an externally supplied sampling clock signal CKS, which is also supplied to the latch and encoder circuit 71.

The functions of the control signal generating circuit can be implemented by a circuit, or by software (programmed operation of a CPU).

Figure 14:
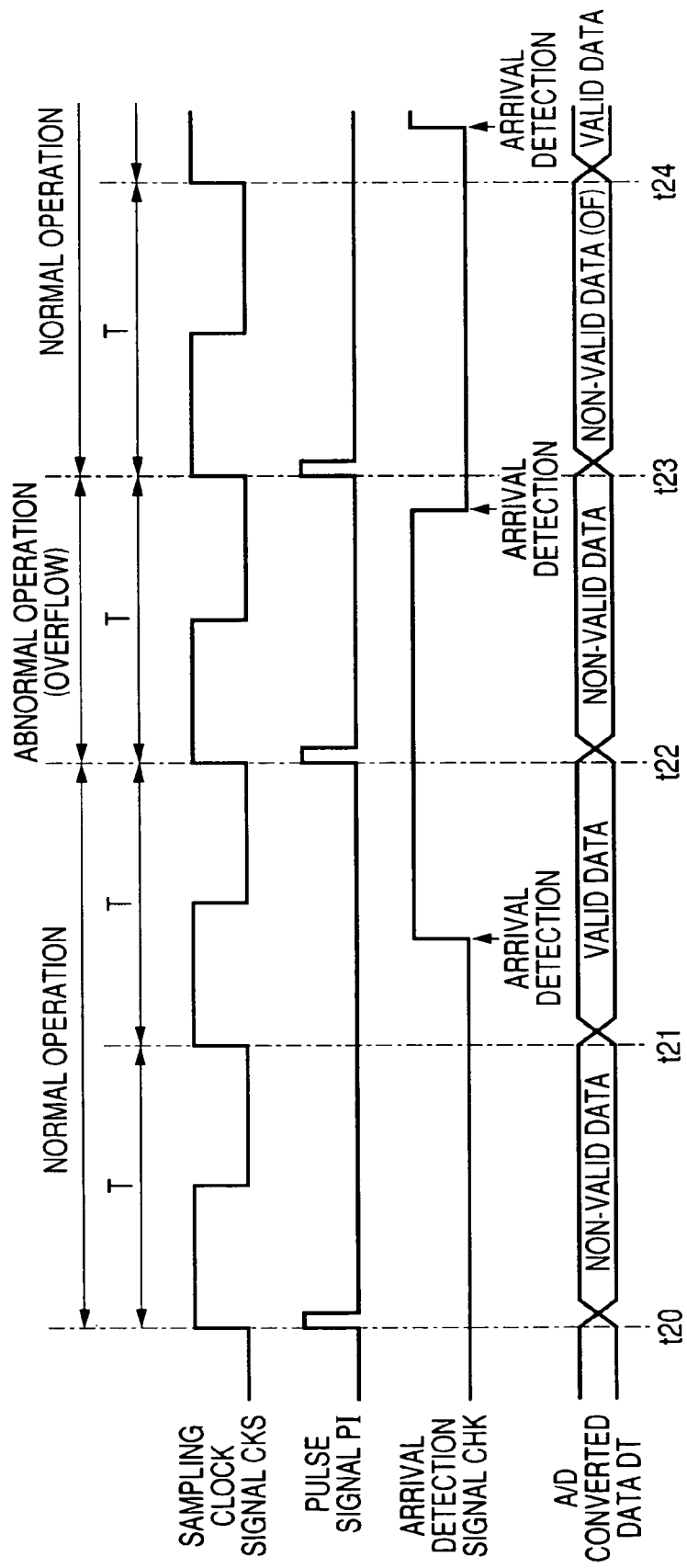
FIG. 14 is a timing diagram for describing the operation of the seventh embodiment.

The control signal generating circuit 74 generates the activation signal PI in synchronism with the sampling clock signal CKS (with this embodiment, as shown in the timing diagram of FIG. 14, in synchronism with a rising edge of the sampling clock signal CKS).

The minimum delay time before the pulse signal is outputted from the final stage delay unit DU of the pulse delay circuit 70 after entering the first-stage delay unit DU will be designated as the lower limit delay interval DLYmin, corresponding to the analog input signal Vin being at an upper limit value Vmax of an allowable range of voltage levels (Vmin-Vmax), while the maximum delay time before the pulse signal is outputted from the final stage delay unit DU of the pulse delay circuit 70 after entering the first-stage delay unit DU will be designated as the upper limit delay interval DLYmin, corresponding to the analog input signal Vin being at the lower limit value Vmin. With this embodiment, the period T of the sampling clock signal CKS is made longer than one-half of the upper limit delay time DLYmax, and shorter than the lower limit delay time DLYmin.

As shown in the timing diagram of FIG. 14, when the pulse signal PI is supplied to the pulse delay circuit 70 from the control signal generating circuit 74 at time point t20, then at the next sampling time point (t21) the latch and encoder circuit 71 derives an A/D converted value DT expressing the voltage level of the analog input signal Vin. At that time, if the level of Vin is within the permissible range of variation, then the pulse signal PI that was inputted by the activation which was performed at time point t20 will not yet have reached the output from the final delay stage of the pulse delay circuit 70, and so will not yet be detected by the arrival detection circuit 73. Hence, the level of the arrival detection signal CHK will be identical to that at the preceding time point (t20) when the pulse delay circuit 70 was activated, and this condition at time point t21 indicates that overflow of the pulse delay circuit 70 has not occurred, i.e., indicates that a normal A/D conversion operation has occurred. As a result, the value DT that is derived by the latch and encoder circuit 71 at time point t21 will be handled as valid data.

At this sampling time point (t21) no activation is performed, i.e. no pulse signal PI is inputted to the pulse delay circuit 70 from the control signal generating circuit 74.

In the example of FIG. 14, at the next sampling time point after time point t21, i.e., t22, the control signal generating circuit 74 determines that the level of the arrival detection signal CHK has been inverted since the preceding sampling time point (thereby indicating that the pulse delay circuit 70 is currently in an initialized condition, since overflow of the pulse delay circuit 70 has occurred), and so supplies a pulse signal PI to the pulse delay circuit 70. The value DT derived by the latch and encoder circuit 71 at that time is handled as non-valid data.

If for some reason (e.g., the voltage level of the analog input signal Vin exceeds the upper limit value) the arrival detection circuit 73 then detects arrival of a pulse signal PI prior to the next sampling time point (t23), then the arrival detection signal CHK will become inverted prior to t23 as illustrated. This indicates that the pulse delay circuit 70 has become prematurely initialized, and so the value DT obtained by the latch and encoder circuit 71 at time point t23 is handled as non-valid data, and the control signal generating circuit 74 supplies a pulse signal PI to again activate the pulse delay circuit 70 at that time. Thereafter, the above operations are successively repeated.

It can thus be understood that with this embodiment, during normal functioning, the operations occurring during the interval from t20 to t22 in the above example are repetitively executed, so that a new (valid) A/D converted value DT is obtained once in every two periods of the sampling clock signal CKS. If premature initialization of the pulse delay circuit 70 occurs (i.e., premature arrival detection, due to the level of the analog input signal Vin being excessively high), then the operations described above that occur at time points t22, t23 in the above example are executed. It is thereby is ensured that resultant incorrect output values DT will not be handled as valid data.

Hence with the A/D converter 7 of this embodiment, a new A/D conversion operation is started at each sampling timing that occurs after arrival of the pulse signal PI has been detected by the arrival detection circuit 73 (thereby confirming that the pulse delay circuit 70 is initialized. Thus, the amount of waiting time before starting each new A/D conversion operation can be minimized, so that high-speed A/D conversion can be achieved.

With this embodiment as described above, an output value DT that is derived by the latch and encoder circuit 71 at the next sampling time point after a pulse signal PI has been supplied to the pulse delay circuit 70 is utilized directly as a valid A/D converted output value. With this form of operation, the control signal generating circuit 74 performs processing in accordance with the flow diagram of FIG. 22.

With an alternative form of this embodiment, the period T of the sampling clock signal CKS is shortened, e.g., such that at least two periods of that signal will occur during the time in which a pulse signal completely traverses the pulse delay circuit 70, under a condition in which the analog input signal Vin is at its highest allowable voltage level. In that case, each time that the arrival detection circuit 73 detects arrival of the pulse signal PI, a count is obtained of the total number of sampling clock signal periods Tp that have elapsed up to that point (more specifically, have elapsed up to but not later than the arrival detection time point), with that count having been started from the preceding activation time point.

In addition, the latch and encoder circuit 71 obtains the total number Td of delay units DU that were traversed by the pulse signal up to a final sampling clock signal CKS period (i.e., the last to occur before the arrival detection circuit 73 detected arrival of the pulse signal). That is to say, at the time point when the arrival detection circuit 73 detects arrival of the pulse signal PI, the aforementioned total number Td is still held latched in the latch and encoder circuit 71. Each output value DT can thus be obtained as the ratio of Td to Tn, since this expresses the number of delay units traversed by the pulse signal per unit time interval during a measurement interval.

Figure 22:
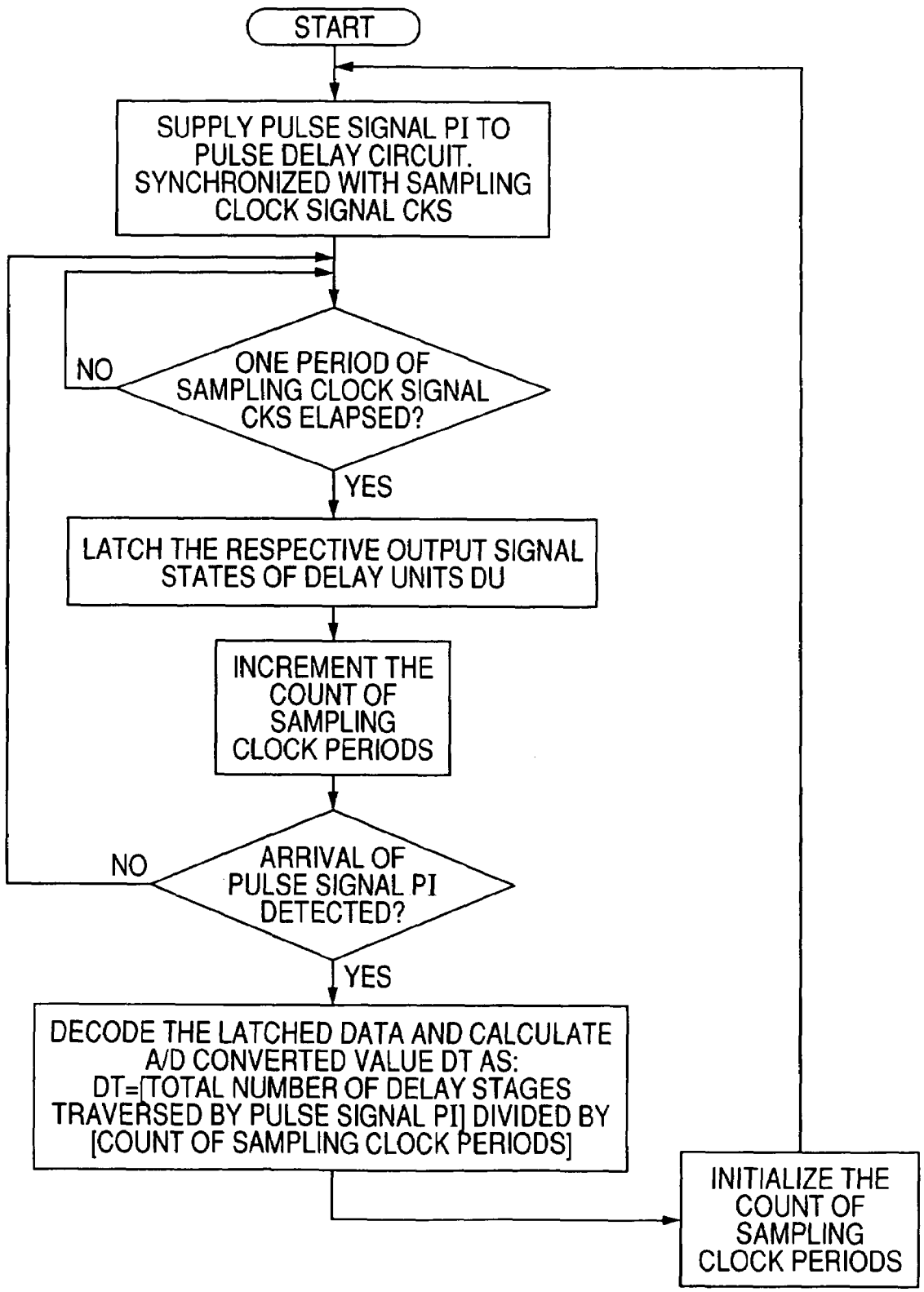
FIG. 22 is a flow diagram of control processing performed with a second form of operation of the seventh embodiment.

In that case, the control signal generating circuit 74 performs processing in accordance with the flow diagram of FIG. 22.

Eighth Embodiment

An eighth embodiment will be described referring to the system block diagram of FIG. 15A and the corresponding timing diagram of FIG. 15B. This embodiment is an A/D converter 8 that is based on n converter core sections 80 (where n is 4, with this embodiment). Apart from the control signal generating circuit 42 being omitted, each of the converter core sections 80 is a TAD module that is made up of the components of the seventh embodiment (the pulse delay circuit 70, the latch and encoder circuit 71, the arrival detection circuit 73 and the control signal generating circuit 74), interconnected as shown in FIG. 13.

The analog input signal Vin and the externally supplied sampling clock signal CKS are supplied in common to each of the converter core sections 80. The n converter core sections 80 receive respectively corresponding individual activation signals PIi (where in general, i=1, 2, . . . n, where n is 4 with this embodiment) designated as PI1, PI2, PI3, PI4 in FIG. 15A. At each of successive sampling time points determined by the sampling clock signal CKS, the converter core sections 80 derive respectively corresponding m-bit output numeric values DTi in accordance with the level of the input signal Vin, designated as DT1, DT2, DT3, DT4 in FIG. 15A.

Each set of respective numeric values DT1 to DTn are summed in an addition circuit 82, to obtain an output A/D converted value DTA having p bits (where $p=m+\log_2 n$). The A/D converter 8 further includes a control signal generating circuit 84 for producing a reference activation signal PI based on the sampling clock signal CKS that is supplied to an edge shift circuit 86. The edge shift circuit 86 produces the n individual activation signals PI1 to PIn (with this embodiment, PI1, PI2, PI3, PI4) for the converter core sections 80, based on the reference activation signal PI.

As shown in FIG. 15B, the edge shift circuit 86 generates the individual activation signals PI1 to PIn (PI1, PI2, PI3, PI4 with this embodiment) with successively differing amounts of delay, i.e., with the delay applied to the i-th inverter being (i×ΔT), where ΔT is a unit delay amount. The edge shift circuit 86 can be configured for example as described for the edge shift circuit 26 of the second embodiment described above, such that ΔT is 1/n times the amount of delay that is currently being applied by each of the delay units in the converter core sections.

Due to the varying amounts of phase shift applied to the individual activation signals PI1 to PIn, the converter core sections 80 have respectively different durations of measurement interval, as illustrated in FIG. 15B, in which the four individual activation signals PI1, PI2, PI3, PI4 define respective measurement intervals TS1 to TS4. Due to the respectively different measurement intervals, correspondingly different numeric values DT1 to DTn will be derived by the converter core sections 80, for the same voltage level of the analog input signal Vin.

As a result of summing the respective numeric values DT1 to DTn that are produced from the converter core sections 80, to obtain each output A/D converted value DTA from the addition circuit 60, the resolution of the output A/D converter data is increased accordingly, as described for the A/D converter 3 of the third embodiment, i.e., by an amount equal to the number of increased bits ($\log_2 n$) in each output A/D converted value DTA, resulting from the summing operation.

It can thus be understood that this embodiment provides similar advantages to those of the seventh embodiment, while also enabling the resolution of D/A conversion to be increased as required.

Ninth Embodiment

Figure 16A:
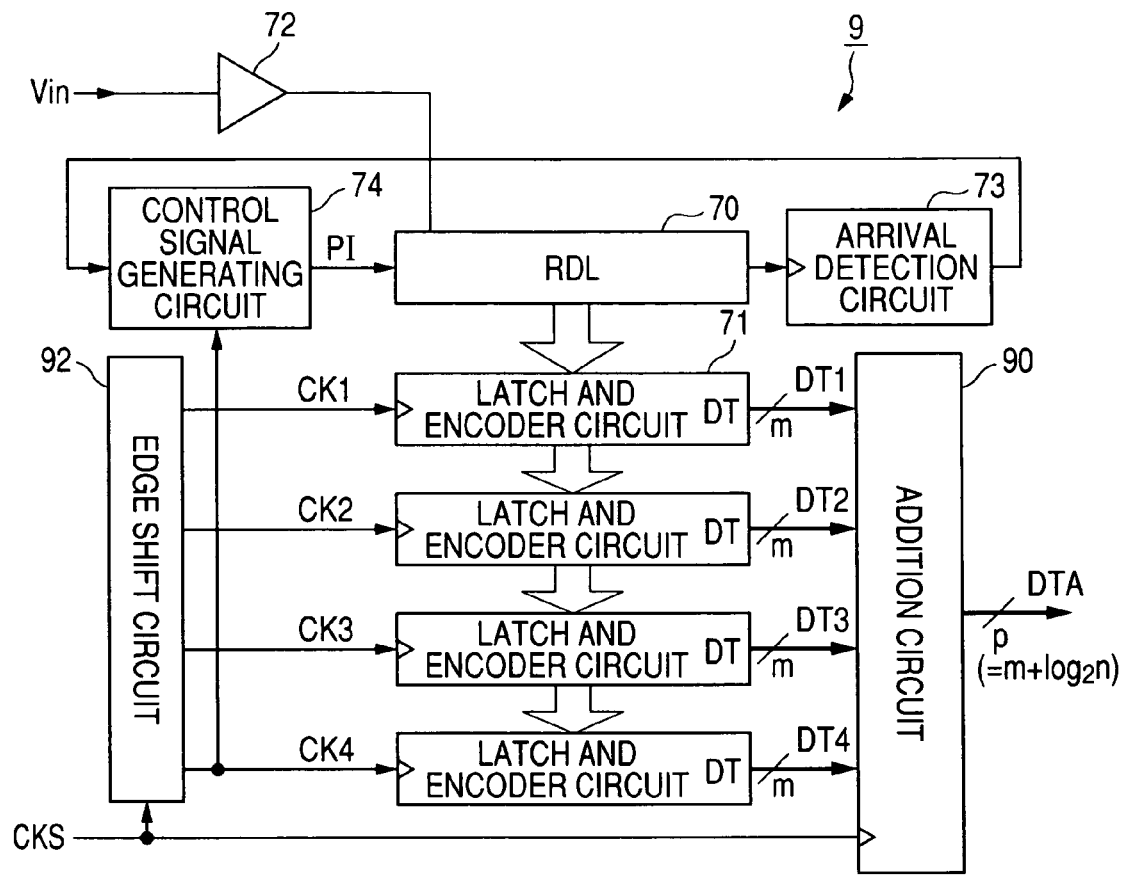
FIG. 16A shows the overall circuit configuration of a ninth embodiment of an A/D converter.

A ninth embodiment will be described referring to the system block diagram of FIG. 16A and the corresponding timing diagram of FIG. 16B. This embodiment is an A/D converter 9 in which a pulse delay circuit 70, an arrival detection circuit 73 and a control signal generating circuit 74 are interconnected and function in the same manner as described for the correspondingly numbered sections of the A/D converter 7 of FIG. 13 (seventh embodiment) described above. However with this embodiment, a set of n latch and encoder circuits 71 (where n is an integer equal to 2 or greater, and is 4 in this embodiment) are connected in common to receive the output signals from the delay units DU of the pulse delay circuit 70, in place of the single pulse delay circuit 70 of the fourth embodiment of FIG. 4.

Each of the n latch and encoder circuits 71 receives a corresponding one of a set of n individual sampling clock signals CK1 to CKn that are produced from an edge shift circuit 92 (i.e., with the i-th latch and encoder circuit 41 receiving the individual pulse signal PIi, where i=1, 2, . . . , n). The edge shift circuit 92 operates from an externally supplied reference sampling clock signal CKS, which is also supplied to an addition circuit 90. The addition circuit 90 functions in the same manner as the addition circuit 52 of the fifth embodiment, to add together each of a set of n numeric values DT1 to DTn (each having m bits) that are periodically produced from the latch and encoder circuits 71, to obtain an A/D converted output value DTA having p bits (where $p=m+\log_2$).

Figure 13:
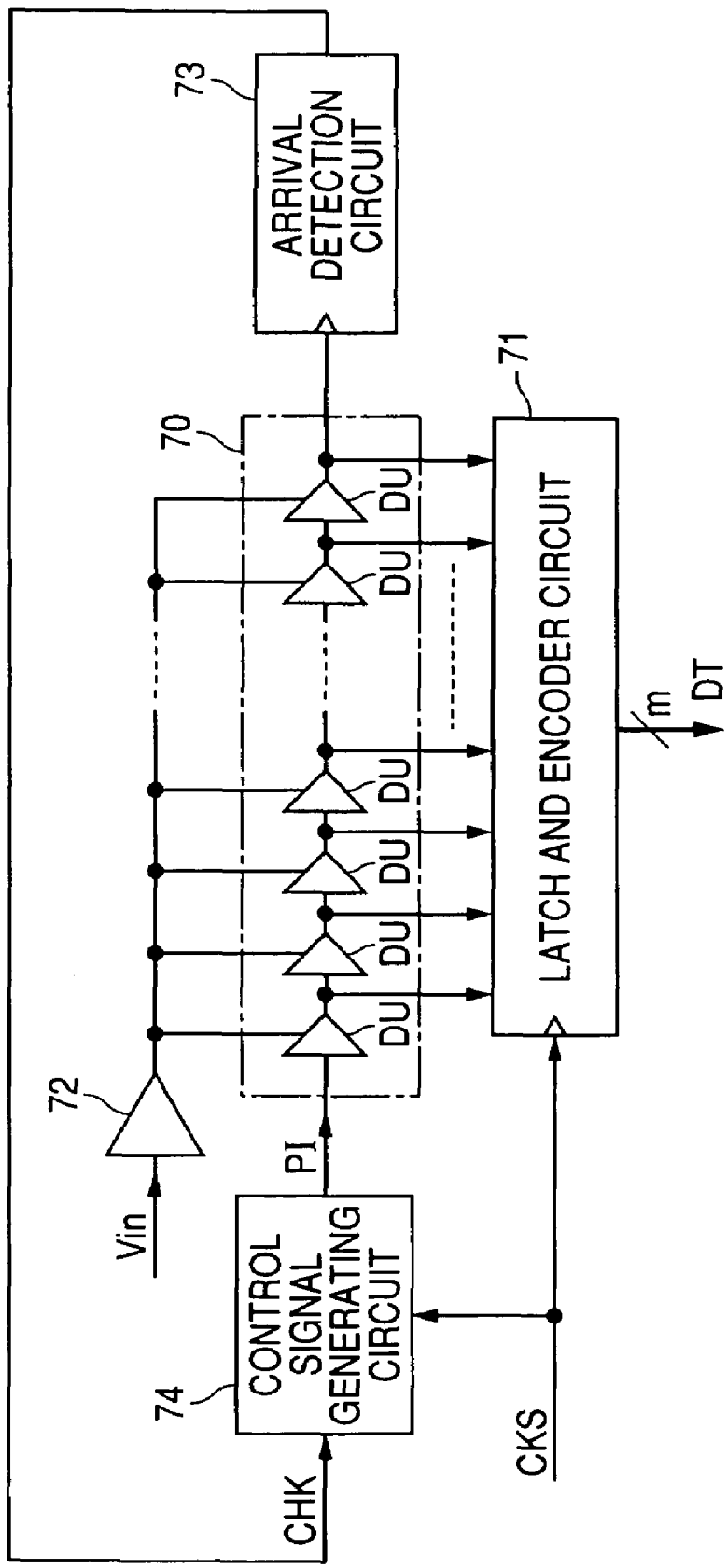
FIG. 13 shows the overall circuit configuration of a seventh embodiment of an A/D converter.

Furthermore with this embodiment, the individual sampling clock signal CKS having the maximum amount of delay (i.e., signal CK4 in FIGS. 16A, 16B) is applied to the control signal generating circuit 74, and performs the same function as described for the sampling clock signal CKS supplied to the control signal generating circuit 74 in the A/D converter 7 of FIG. 13.

Figure 16B:
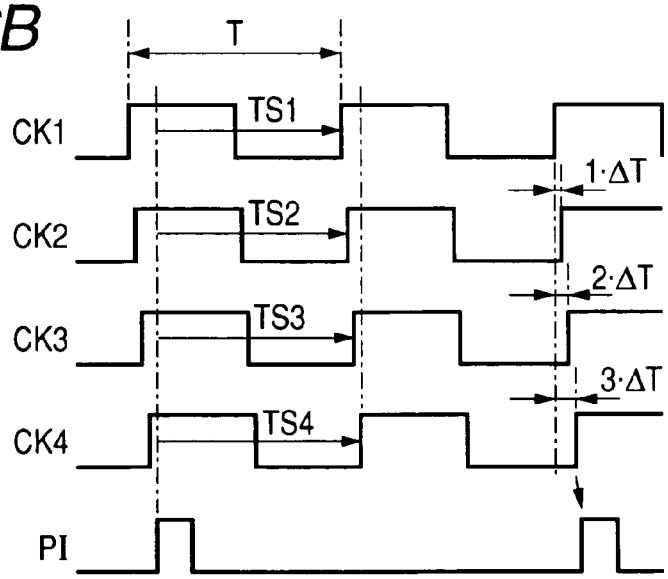
FIG. 16B is a timing diagram for describing the operation of the ninth embodiment.

As illustrated in FIG. 16B, in response to the reference sampling clock signal CKS, the edge shift circuit 92 generates the n individual sampling clock signal CK1 to CKn successively shifted in phase from one another by an identical unit time amount ΔT that is 1/n times the amount of delay that is currently being applied by each of the delay units in the pulse delay circuit 70, i.e., have successively increasing amounts of phase delay.

With this embodiment as shown in FIG. 16B, each of respective individual measurement intervals TS1 to TSn, e.g., an individual measurement interval TSi of the i-th one of the latch and encoder circuits 71, commences from a rising edge of the pulse signal PI produced from the control signal generating circuit 74 (generated in response to a rising edge of the n-th individual sampling clock signal CKn), and continues until the next rising edge of the corresponding one of the n individual sampling clock signals CK1 to CKn. During such an individual measurement interval, the total number of delay units DU in the pulse delay circuit 70 traversed by the pulse signal PI is obtained and a corresponding numeric value DTi is derived therefrom and is outputted by the corresponding one of the latch and encoder circuits 71 to the addition circuit 90. Due to the respectively different measurement intervals of the latch and encoder circuits 71, correspondingly different numeric values DT1 to DTn will be derived by the latch and encoder circuits 71, for the same voltage level of the analog input signal Vin.

Hence as a result of summing each set of respective numeric values DT1 to DTn produced from the latch and encoder circuits 71 to obtain each output A/D converted value DTA from the addition circuit 90, the resolution of the output A/D converter data is increased accordingly, for the same reasons as described for the A/D converter 3 of the third embodiment shown in FIG. 8A, i.e., the resolution is increased by an amount equal to the number of increased bits ($\log_2 n$) in each output A/D converted value DTA, resulting from the summing operation.

It can thus be understood that this embodiment provides similar advantages to those of the eighth embodiment described above, while moreover enabling the overall circuit scale of the A/D converter to be reduced, This is due to the fact that instead of utilizing a plurality of converter core sections (TAD modules) as for the eighth embodiment, the ninth embodiment utilizes a plurality of latch and encoder circuits 71 which operate in common from one pulse delay circuit 70.

Tenth Embodiment

Figure 17:
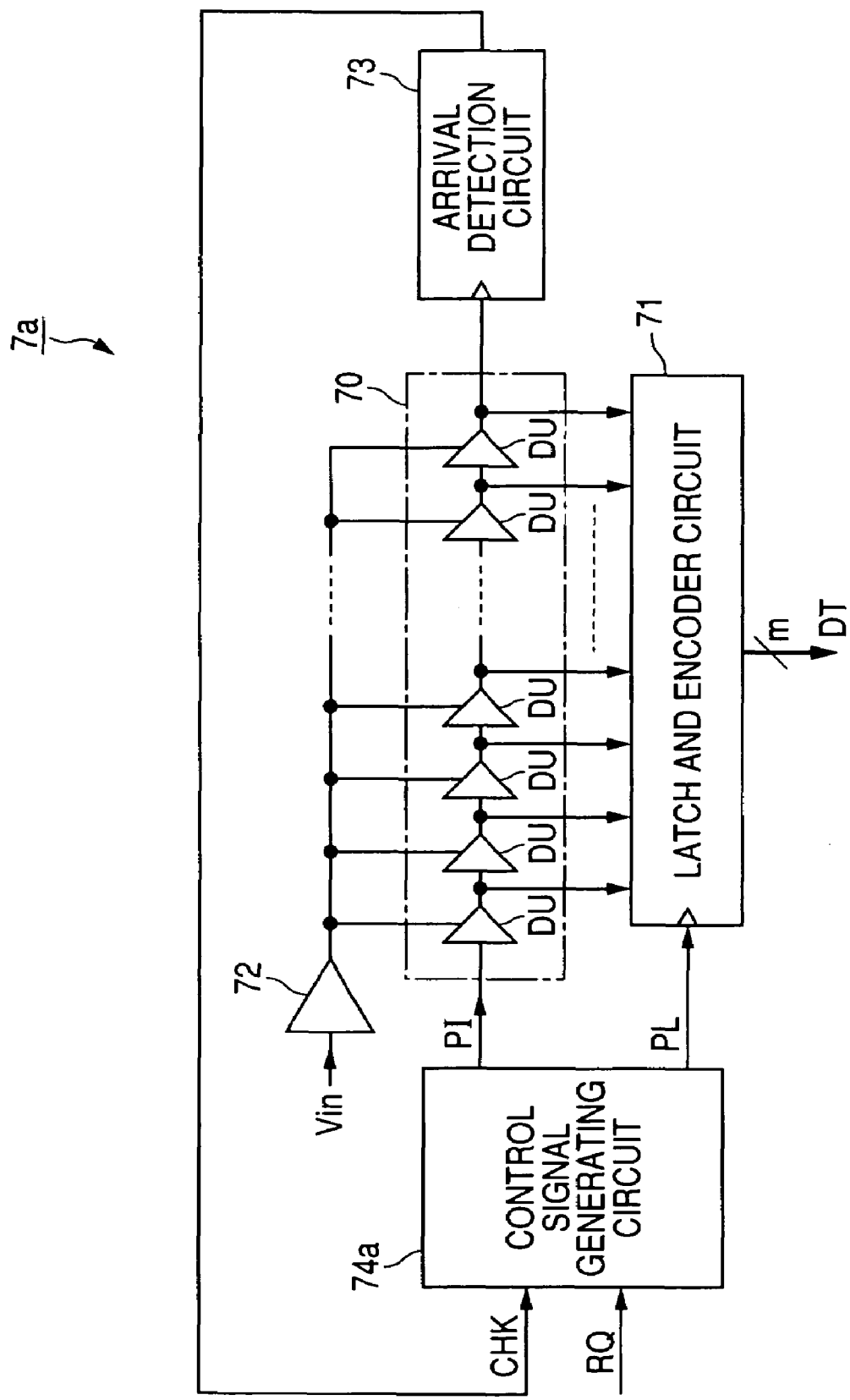
FIG. 17 shows the overall circuit configuration of a tenth embodiment of an A/D converter.

A tenth embodiment will be described referring to FIG. 17, and the corresponding timing diagram of FIG. 18. This embodiment is an A/D converter 7a, in which a pulse delay circuit 70, a latch and encoder circuit 71, a buffer circuit 72 and an arrival detection circuit 73 respectively correspond in configuration and function to the identically numbered sections of the seventh embodiment shown in FIG. 7 so that description will be given primarily with respect to the control signal generating circuit 74a of this embodiment (which replaces the control signal generating circuit 74 of the seventh embodiment).

The control signal generating circuit 74a receives the arrival detection signal CHK that is produced from the arrival detection circuit 73 each time the pulse signal PI is outputted from the final stage of the pulse delay circuit 70 (i.e., the pulse delay circuit 70 returns to the initialized state) as described for the seventh embodiment, and also receives an externally supplied measurement request signal RQ that is supplied each time an A/D conversion operation is to be performed to obtain an updated output value DT.

As illustrated in FIG. 18, when a measurement request signal RQ is supplied, the control signal generating circuit 74a will supply a pulse signal PI (as a short-duration pulse) to the input stage of the pulse delay circuit 70 and will thereafter supply a latch signal PL to the latch and encoder circuit 71 after a measurement interval TS has elapsed, only if a specific condition is satisfied. If that condition is not satisfied at that point in time, the control signal generating circuit 74a will wait until it is satisfied, before supplying the pulse signal PI to the pulse delay circuit 70.

The specific condition is that, subsequent to the end of a preceding measurement operation (A/D conversion) performed in response to receiving a measurement request signal RQ, the arrival detection circuit 73 has detected that the pulse delay circuit 70 has returned to the initialized condition. Specifically, when a measurement request signal RQ is received, the control signal generating circuit 74a must find that the level of the arrival detection signal CHK has been inverted from the level at the immediately preceding occasion when the pulse signal PI was inputted to the pulse delay circuit 70. If so, the control signal generating circuit 74a will immediately supply the pulse signal PI to the pulse delay circuit 70, and thereafter supply the latch signal PL to the latch and encoder circuit 71 after a measurement interval TS has elapsed, as illustrated in the timing diagram of FIG. 18.

When the latch and encoder circuit 71 receives the latch signal PL, it operates in the same manner as described for the latch and encoder circuits of the preceding embodiments operating in response to the sampling clock signal CKS.

In the specific example of FIG. 18, a measurement request signal RQ is supplied at time point t30, so that (assuming that the aforementioned condition is satisfied) the control signal generating circuit 74a supplies a pulse signal PI to the pulse delay circuit 70. After the measurement interval TS has elapsed, the control signal generating circuit 74a supplies a latch signal PL to the latch and encoder circuit 71. Based on the output states of the respective stages of the pulse delay circuit 70, the latch and encoder circuit 71 then derives an A/D converted output value DT, having m bits, proportional to the voltage level of the analog input signal Vin.

Subsequently, when the pulse signal PI is outputted from the final stage of the pulse delay circuit 70 and arrives at the arrival detection circuit 73, i.e., an arrival detection time point occurs, the level of the arrival detection signal CHK becomes inverted. Thus when the measurement request signal RQ is thereafter again supplied, at time point t31, the same sequence of operations is performed as those which commenced from time point t30.

Next with this example, the measurement request signal RQ is again supplied to the control signal generating circuit 74a, at a time point t32. This is a time point which occurs following a preceding measurement interval TS, but before a corresponding arrive detection time point has been reached, i.e., before the arrival detection signal CHK has again been inverted. Hence, the above-described condition is not yet satisfied, so that the control signal generating circuit 74a waits until the arrival detection signal CHK has again become inverted. When that occurs, the control signal generating circuit 74a again supplies a pulse signal PI to the pulse delay circuit 70, and another A/D conversion operation begins.

It can thus be understood that with this embodiment, each time the measurement request signal RQ is supplied at a time when the pulse delay circuit 70 has returned to the initialized condition, a new A/D conversion operation can be immediately commenced. Hence, the unnecessary waiting time that may occur when a fixed-frequency clock signal (CKS) is used to control the latch and encoder circuit 71 can be eliminated.

That is to say, with this embodiment, waiting is performed (following a sampling time point) only when actually necessary, i.e., when the voltage of the analog input signal Vn falls below some specific level, and the wait is performed only for a minimum required duration.

Specifically, the sampling interval TS must be made at least slightly shorter than the time taken for the pulse signal to traverse the pulse delay circuit when the analog input signal Vin is at the highest value (Vmax) of its allowable range of variation. The minimum interval between successive inputs of the RQ signals must be at least slightly longer than TS.

Thus with this embodiment, high-speed continuous A/D conversion can be achieved if the measurement request signals RQ are repetitively supplied with a fixed period that meets the above condition. The "RQ signals" can be constituted as successive pulses, or as successive level transitions of a control signal. The functions of the control signal generating circuit 74a can be implemented in hardware or by software control of a CPU, as described for the control signal generating circuit 74.

Eleventh Embodiment

Figure 19A:
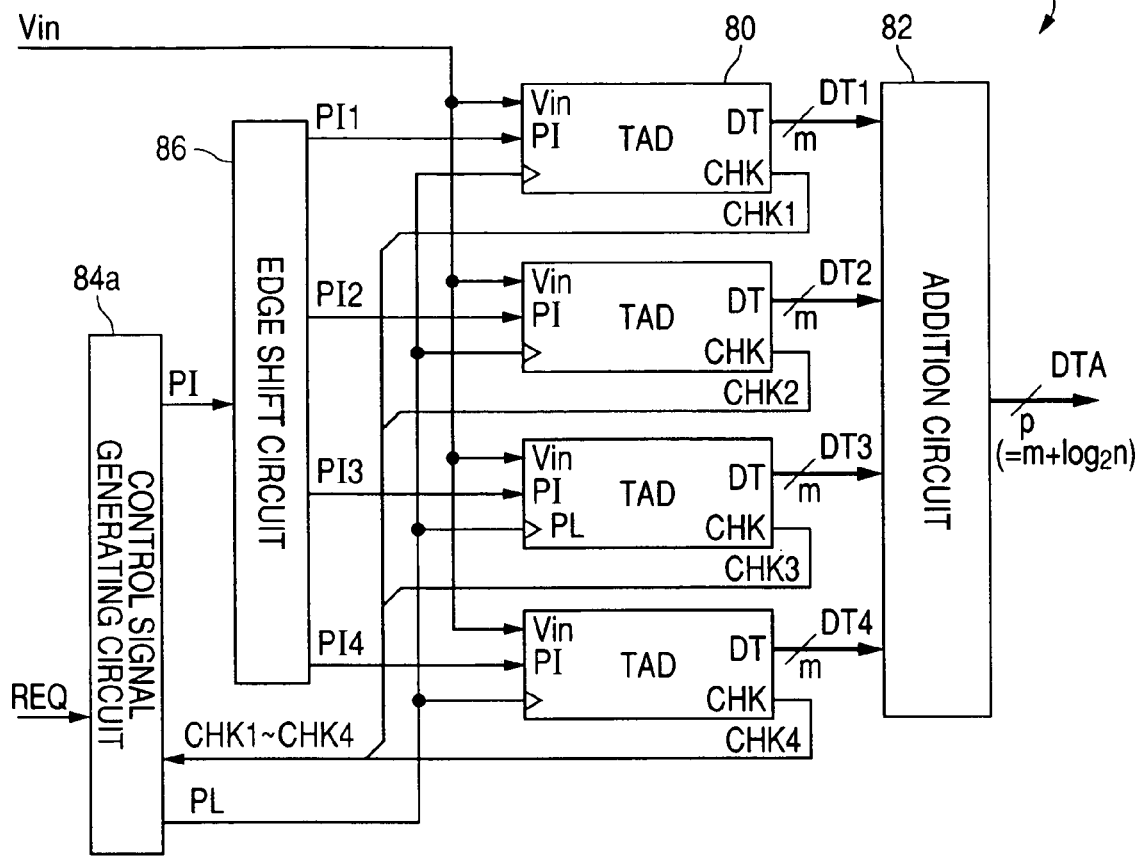
FIG. 19A shows the overall circuit configuration of an eleventh embodiment of an A/D converter.

An eleventh embodiment will be described referring to FIG. 19A and the corresponding timing diagram of FIG. 19B. This embodiment is an A/D converter 8a having a set of n converter core sections 80 (in this example, n being equal to four, each of identical configuration to the converter core sections 80 of the eighth embodiment described above, and also includes an addition circuit 82 and an edge shift circuit 86 which respectively correspond in function and configuration to the addition circuit 82 and edge shift circuit 86 of the eighth embodiment, so that further description of these will be omitted, and the description will be mainly directed to the control signal generating circuit 84a of this embodiment.

The control signal generating circuit 84a receives successive externally supplied measurement request signals RQ as described for the tenth embodiment, and each of respective individual arrival detection signals CHKi (i=1, 2, . . . n) produced from the converter core sections 80, and generates a reference pulse signal PI that is supplied to the edge shift circuit 86, and a latch signal PL that is supplied to each of the converter core sections 80. Each of the individual arrival detection signals CHKi is generated by the corresponding one of the converter core sections 80 in the same way as described for the arrival detection signal CHK of the A/D converter 8 of the tenth embodiment above.

With this embodiment, when a measurement request signal RQ is received, the control signal generating circuit 84a immediately supplies the a reference pulse signal PI to the edge shift circuit 86 if all of the individual arrival detection signals CHKi are at the appropriate level, i.e., each of these signals has been inverted from the level at the last occasion when a reference pulse signal PI was generated. If that condition is not yet satisfied, the control signal generating circuit 84a waits until all of the individual arrival detection signals CHKi have attained the appropriate level, before supplying the reference pulse signal Pi to the edge shift circuit 86, in the same way as described for the control signal generating circuit 74a of the tenth embodiment above. In that way, it is ensured that all of the converter core sections 80 have been initialized, before commencing a new A/D conversion operation.

Figure 19B:
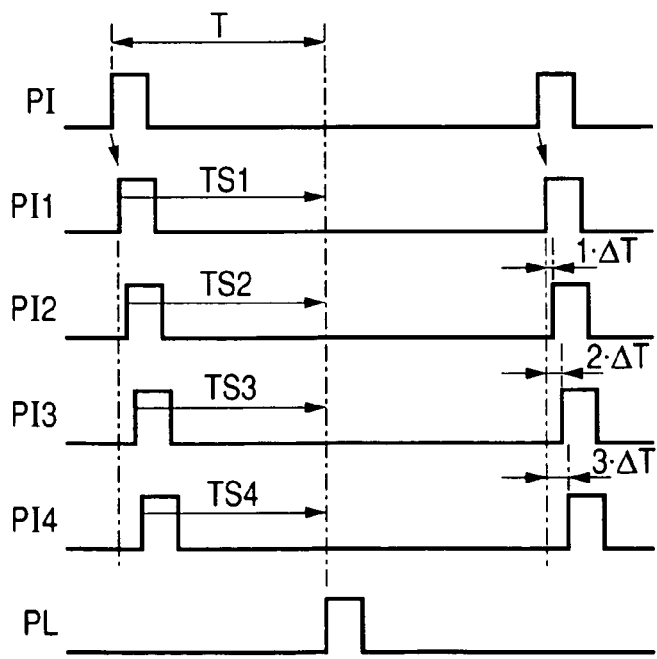
FIG. 19B is a timing diagram for describing the operation of the eleventh embodiment.

In response to the reference pulse signal Pi, the edge shift circuit 86 generates successively phase-shifted individual pulse signals PIi as described for the eighth embodiment, as illustrated in FIG. 19B. The control signal generating circuit 84a generates a latch signal PL as shown, after a fixed time interval T has elapsed following outputting of the reference pulse signal PI from the control signal generating circuit 84a. Hence, respectively different measurement intervals TSi are established for the converter core sections 80.

It can thus be understood that with this embodiment, each of the converter core sections 80 operates in the same manner as the A/D converter 8 of the tenth embodiment, with each latch operation being performed by the latch and encoder circuit 71 of each converter core section 80 in synchronism with the latch signal PL supplied from the control signal generating circuit 84*a,* instead of a fixed-frequency sampling clock signal CKS.

Hence, this embodiment provides the advantages described for the tenth embodiment, while also enabling an increased degree of resolution of A/D conversion to be achieved, due to the fact that at each conversion operation, respective numeric values DT1 to DTn (each having m bits) that are respectively derived by the n converter core sections 80 in corresponding measurement intervals of respectively different duration (TS1 to TSn) are added together by the addition circuit 82, to obtain an output A/D converted value DTA having p bits (where $p = m + \log_2 n$).

It should be noted that although the invention has been described above with respect to specific embodiments, various modifications to these, or combinations of features of respective embodiments, could be envisaged that fall within the scope claimed for the invention, as set out in the appended claims.

What is claimed is:

1. An A/D (analog-to-digital) converter comprising
a pulse delay circuit controllable for being activated to commence transferring a pulse signal therethrough, comprising a plurality of delay units connected in series as successive delay stages in a ring delay line configuration, each of said delay units applying to said pulse signal an identical amount of delay with said delay amount varying in accordance with a voltage level of an analog input signal,
a circulation number counter circuit for counting a number of complete circulations of said pulse signal around said pulse delay circuit, and
a latch and encoder circuit controlled by an externally supplied sampling clock signal having a predetermined sampling period, for registering respective output signals produced from said delay units of said pulse delay circuit and from said circulation number counter circuit at each of respective sampling time points defined by said sampling clock signal, to thereby derive a total number of said delay units traversed by said pulse signal since a commencement of activation of said pulse delay circuit, and for producing an output A/D (analog-to-digital) converted value in accordance with said total number;
wherein said A/D converter comprises a control signal generating circuit for generating, based on said sampling clock signal:
an activation control signal synchronized with said sampling clock signal, for periodically inhibiting circulation of said pulse signal around said pulse delay circuit during a pause interval having a duration that is longer than a circulation period of said pulse signal and is shorter than said sampling period, and for activating said pulse delay circuit upon termination of said pause interval, and
an initialization signal for initializing said circulation number counter circuit during each of said pause intervals.

2. An A/D converter according to claim 1, comprising a shift circuit for generating n individual sampling clock signals (where n is an integer of 2 or greater) based on said sampling clock signal, with said n individual sampling clock signals successively differing in phase from one another by an amount equal to 1/n times an amount of delay that is currently being applied by each of said delay units, and comprising:
n pulse position numeric conversion circuits each coupled to said pulse delay circuit and said circulation number counter circuit, with each of said pulse position numeric conversion circuits repetitively deriving a numeric value expressing a total number of said delay units traversed by said pulse signal during an individual measurement interval that extends from an activation time point up to a sampling time point that is defined by said corresponding individual sampling clock signal, and
an addition circuit for periodically adding together respective numeric values produced by said pulse position numeric conversion circuits, to obtain an output A/D (analog-to-digital) converted value based on a result of said addition.

3. An A/D converter according to claim 1, wherein said pulse delay circuit is adapted to become initialized at a transition of said initialization signal from said first level to said second level and to halt circulation of said pulse signal while said activation control signal is at said first level, and wherein said control signal generating circuit comprises an edge detector circuit, comprising
a timing delay circuit which receives said sampling clock signal, and delays said sampling clock signal by an amount equal to said pause interval duration, and
a logic circuit for generating said activation control signal based on input and output signals of said timing delay circuit, with said activation control signal being held at said first level only during the entirety of each of said pause intervals.

4. An A/D converter according to claim 3, wherein said circulation number counter circuit is adapted to become initialized when said initialization signal attains said second level, and wherein said logic circuit operates on said input and output signals of said pulse delay circuit to produce said initialization signal as a signal that attains said second level only during each of said pause intervals.

5. An A/D converter according to claim 3, wherein said timing delay circuit comprise a plurality of delay units connected in series as respective delay stages and each having identical delay characteristics to those of said delay units of said pulse delay circuit.

6. An A/D converter according to claim 3, wherein said timing delay circuit comprise a plurality of delay units connected in series as respective delay stages, with a total number thereof being greater than a total number of said delay units of said pulse delay circuit.

7. An A/D converter according to claim 6, wherein said analog input signal is applied as a power supply voltage of said pulse delay circuit, and wherein a power supply voltage of said timing delay circuit is maintained at a level lower than said analog input signal voltage.

8. An A/D converter according to claim 7, wherein said power supply voltage of said timing delay circuit is a fixed DC voltage whose value is lower than a minimum value of a predetermined range of allowable variation said analog input signal voltage.

9. An A/D converter according to claim 7, comprising a voltage divider circuit coupled to receive said analog input signal, wherein a voltage-divided output signal from said voltage divider circuit is applied as said power supply voltage of said timing delay circuit.

10. An A/D (analog-to-digital) converter comprising;
n converter core sections (where n is an integer of 2 or greater) which operate in common on an analog input signal, and each comprise a pulse delay circuit controllable for being activated to commence transferring a pulse signal therethrough, comprising a plurality of delay units connected in series as successive delay stages in a ring delay line configuration, each of said delay units applying to said pulse signal an identical amount of delay with said delay amount varying in accordance with a voltage level of an analog input signal, a circulation number counter circuit for counting a number of complete circulations of said pulse signal around said pulse delay circuit, and a latch and encoder circuit controlled by an externally supplied sampling clock signal having a predetermined sampling period, for registering respective output signals produced from said pulse delay circuit and said circulation number counter circuit at each of periodic sampling time points defined by said sampling clock signal, to thereby derive a total number of said delay units traversed by said pulse signal since a preceding individual activation time point, and for producing an output numeric value in accordance with said total number; and a control signal generating circuit for generating, based on said sampling clock signal, n individual activation control signals that successively differ in phase from one another by an amount equal to 1/n times a delay time that is currently being applied by each of said delay units and which are supplied to respectively corresponding ones of said converter core sections, for periodically inhibiting operation of said pulse delay circuit of said corresponding converter core section during a pause interval which commences at each of said individual sampling time points and has a duration that is longer than a circulation period of said pulse signal and is shorter than a period of said sampling clock signal, and for activating said pulse delay circuit of the corresponding converter core section upon termination of said individual pause interval, and an initialization signal for initializing said circulation number counter circuit of the corresponding converter core section during said individual pause intervals; and an addition circuit for periodically adding together respective numeric values produced by said converter core sections, to obtain an output A/D (analog-to-digital) converted value based on a result of said addition.

11. An A/D (analog-to-digital) converter comprising a pulse delay circuit comprising a plurality of delay units connected in series as successive delay stages in a straight delay line configuration, with said pulse delay circuit being periodically activated by being supplied with a pulse signal at each of respective activation time points, each of said delay units applying to said pulse signal an identical amount of delay with said delay amount varying in accordance with a voltage level of an analog input signal, and a latch and encoder circuit controlled by an externally supplied sampling clock signal having a predetermined sampling period, for registering respective states of output signals produced from said delay units at each of periodic sampling time points defined by said sampling clock signal to thereby derive a total number of said delay units traversed by said pulse signal from a preceding activation time point up to said sampling time point, and for producing an output A/D converted value in accordance with said total number;

wherein said A/D converter comprises:

an arrival detection circuit for producing an arrival detection signal expressing each of respective timings at which said pulse signal is outputted from a final-stage delay unit of said pulse delay circuit, and a control signal generating circuit operating in synchronism with said sampling clock signal, responsive to said arrival detection signal for supplying said pulse signal to said pulse delay circuit at said activation time points;

wherein subsequent to each of said activation time points, said control signal generating circuit inhibits activation of said pulse delay circuit until said arrival detection signal indicates that a pulse signal resulting from an immediately preceding activation has reached said final-stage delay unit.

12. An A/D converter according to claim 11, comprising a shift circuit for generating n individual sampling clock signals where n is an integer of 2 or greater, based on said externally supplied sampling clock signal, with said n individual sampling clock signals successively differing in phase from one another by an amount equal to 1/n times an amount of delay that is currently being applied by each of said delay units, n latch and decoder circuits coupled to receive respectively corresponding ones of said individual sampling clock signals and coupled in common to said pulse delay circuit, with each of said latch and decoder circuits deriving a numeric value expressing a total number of said delay units traversed by said pulse signal during a measurement interval that extends from an activation time point up to a sampling time point defined by said corresponding individual sampling clock signal, and an addition circuit for periodically adding together respective numeric values produced by said latch and decoder circuits, to obtain an output A/D (analog-to-digital) converted value based on a result of said addition.

13. An A/D (analog-to-digital) converter comprising n converter core sections, where n is an integer of 2 or greater, each comprising a pulse delay circuit comprising a plurality of delay units connected in series as successive delay stages in a straight delay line configuration, with said pulse delay circuit being periodically activated at respective individual activation time points by being supplied with an individual pulse signal, each of said delay units applying to said individual pulse signal an identical amount of delay with said delay amount varying in accordance with a voltage level of an analog input signal, a latch and encoder circuit controlled by an externally supplied sampling clock signal having a predetermined sampling period, for registering respective states of output signals produced from said delay units at each of periodic sampling time points defined by said sampling clock signal to thereby derive a total number of said delay units traversed by said individual pulse signal from a preceding individual activation time point up to said sampling time point, and for producing an output numeric value in accordance with said total number, and an arrival detection circuit for producing an individual arrival detection signal indicating each time point at which said individual pulse signal attains a final-stage delay unit of said pulse delay circuit;

wherein said A/D converter comprises a control signal generating circuit coupled to receive said sampling clock signal and each of said individual arrival detection signals from said converter core sections, for generating n individual pulse signals that successively differ in phase from one another by an amount equal to 1/n times a delay time that is currently being applied by each of said delay units, and for supplying said individual activation control signals to respectively corresponding ones of said converter core sections, for determining said individual activation time points, and wherein subsequent to each occurrence of supplying said n individual activation control signals, said clock signal generating circuit inhibits further supplying of said individual activation control signals until each of said individual arrival detection signals indicates that a pulse signal resulting from an immediately preceding activation has become outputted from the final-stage delay unit in the corresponding one of said converter core sections.

14. An A/D (analog-to-digital) converter comprising a pulse delay circuit controllable for being activated to commence transferring a pulse signal therethrough at each of respective activation time points, comprising a plurality of delay units connected in series as successive delay stages in a straight delay line configuration, each of said delay units applying to said pulse signal an identical amount of delay with said delay amount varying in accordance with a voltage level of an analog input signal, and a latch and encoder circuit controlled by an externally supplied sampling clock signal having a predetermined sampling period, for registering respective states of output signals produced from said delay units at each of periodic sampling time points defined by said sampling clock signal, to thereby derive a total number said delay units traversed by said pulse signal from a preceding activation time point up to said sampling time point, and for producing an output A/D converted value in accordance with said total number;

wherein said A/D converter comprises a control signal generating circuit which operates based on said sampling clock signal, for periodically activating said pulse delay circuit by inputting a pulse signal thereto, with an activation period that is k times said sampling period where k is an integer equal to 2 or greater, and wherein said activation period is longer than a time interval required for said pulse signal to completely traverse said pulse delay circuit when said analog input signal voltage is at a lowest value of a predetermined range of permissible voltage levels, and said predetermined sampling period is shorter than a time interval required for said pulse signal to completely traverse said pulse delay circuit when said analog input signal voltage is at a highest value of said predetermined range.

15. An A/D converter according to claim 14, comprising an edge shift circuit for generating n individual sampling clock signals (where n is an integer of 2 or greater) based on said externally supplied sampling clock signal, with said n individual sampling clock signals successively differing in phase from one another by an amount equal to 1/n times an amount of delay that is currently being applied by each of said delay units and comprising:

n latch and decoder circuits coupled to receive respectively corresponding ones of said individual sampling clock signals and coupled in common to said pulse delay circuit, with each of said latch and decoder circuits periodically deriving a numeric value expressing a total number of said delay units traversed by said pulse signal during an individual measurement interval that extends from one of said activation time points up to a sampling time point defined by said corresponding individual sampling clock signal, and an addition circuit for periodically adding together respective numeric values produced by said pulse position numeric conversion circuits, to obtain an output A/D (analog-to-digital) converted value based on a result of said addition;

wherein said control signal generating circuit receives a specific one of said individual sampling clock signals, which is delayed in phase by a maximum amount among said individual sampling clock signals, and generates said pulse signal based upon said specific individual sampling clock signal.

16. An A/D (analog-to-digital) converter comprising;

n converter core sections (where n is an integer of 2 or greater) each comprising a pulse delay circuit controllable for being activated to commence transferring a pulse signal therethrough at each of respective individual activation time points, comprising a plurality of delay units connected in series as successive delay stages in a straight delay line configuration, each of said delay units applying to said pulse signal an identical amount of delay with said delay amount varying in accordance with a voltage level of an analog input signal, and a latch and encoder circuit controlled by an externally supplied sampling clock signal having a predetermined sampling period, for registering respective output signals produced from said pulse delay circuit at each of periodic sampling time points defined by said sampling clock signal, to thereby derive a total number said delay units traversed by said pulse signal in a measurement interval extending from an immediately preceding individual activation time point up to said sampling time point, and for producing an output numeric value in accordance with said total number;

a control signal generating circuit coupled to receive said sampling clock signal, for generating n individual pulse signals that successively differ in phase from one another by an amount equal to 1/n times a delay time that is currently being applied by each of said delay units and which are supplied to activate respectively corresponding ones of said converter core sections, for determining said individual sampling time points, with each of said individual pulse signals having an activation period that is k times said sampling period, where k is an integer equal to 2 or greater; and an addition circuit for periodically adding together respective numeric values produced by said converter core sections, to obtain an output A/D converted value based on a result of said addition;

wherein said sampling period is made shorter than a time interval required for a pulse signal to completely traverse a pulse delay circuit under a condition in which said voltage of said analog input signal is at a maximum value of a predetermined range of permissible voltage levels, and each of said individual activation control signals has a period that is longer than a time interval required for pulse signal to completely traverse a pulse delay circuit under a condition in which said analog input signal voltage is at a lowest value of said predetermined range.

17. An A/D (analog-to-digital) converter comprising a pulse delay circuit controllable for being activated to commence transferring a pulse signal therethrough at each of respective activation time points, comprising a plurality of delay units connected in series as successive delay stages in a straight delay line configuration, each of said delay units applying to said pulse signal an identical amount of delay with said delay amount varying in accordance with a voltage level of an analog input signal, and a latch and encoder circuit controlled by an externally supplied sampling clock signal having a predetermined sampling period, coupled to said pulse delay circuit for deriving a total number said delay units traversed by said pulse signal from a preceding activation time point up to said sampling time point, and for producing an output A/D (analog-to-digital) converted value in accordance with said total number;

wherein said A/D converter comprises:

an arrival detection circuit for producing an arrival detection signal expressing each of respective timings at which said pulse signal is outputted from a final-stage delay unit of said pulse delay circuit, and a control signal generating circuit coupled to receive said arrival detection signal and an externally supplied activation request signal, for generating said pulse signal to activate said pulse delay circuit;

wherein said control signal generating circuit responds to said activation request signal by supplying a pulse signal to activate said pulse delay circuit, and supplying a latch signal to said latch and encoder circuit for defining a sampling time point after a predetermined interval has elapsed following said activation, and wherein subsequent to each said activation, said control signal generating circuit inhibits further activation of said pulse delay circuit until said arrival detection signal indicates that a pulse signal resulting from an immediately preceding activation of said pulse delay circuit has become outputted from said final-stage delay unit.

18. An A/D (analog-to-digital) converter comprising n converter core sections, where n is an integer of 2 or greater, each comprising a pulse delay circuit controllable for being activated to commence transferring a pulse signal therethrough at each of respective individual activation time points, comprising a plurality of delay units connected in series as successive delay stages in a straight delay line configuration, each of said delay units applying to said pulse signal an identical amount of delay with said delay amount varying in accordance with a voltage level of an analog input signal, and a latch and encoder circuit controlled by an externally supplied sampling clock signal having a predetermined sampling period, for registering respective states of output signals produced from said delay units at each of periodic sampling time points defined by said sampling clock signal to thereby derive a total number of said delay units traversed by said pulse signal from a preceding activation time point up to said sampling time point, and for producing an output numeric value in accordance with said total number, and an arrival detection circuit for producing an individual arrival detection signal indicating each time point at which said pulse signal reaches final-stage delay unit of said pulse delay circuit;

wherein said A/D converter comprises a control signal generating circuit coupled to receive each of said individual arrival detection signals from said converter core sections and an externally supplied activation request signal, responsive to said activation request signal for generating n individual pulse signals that successively differ in phase from one another by an amount equal to 1/n times a delay time that is currently being applied by each of said delay units, and for supplying said individual pulse signals to respectively corresponding ones of said converter core sections for activating said converter core sections at said individual activation time points, and wherein subsequent to each occurrence of supplying said n individual pulse signals, said control signal generating circuit inhibits further supplying of said individual pulse signals until each of said individual arrival detection signals indicates that a pulse signal resulting from an immediately preceding activation of the corresponding pulse delay circuit has arrived at the final-stage delay unit in the corresponding converter core section.

* * * * *